United States Patent [19]
Sogabe

[11] Patent Number: 5,638,406
[45] Date of Patent: Jun. 10, 1997

[54] CARRIER DETECTOR

[75] Inventor: Yasushi Sogabe, Kamakura, Japan

[73] Assignee: Mitsubishi Denki Kabushiki Kaisha, Tokyo, Japan

[21] Appl. No.: 184,001

[22] Filed: Jan. 19, 1994

[30] Foreign Application Priority Data

| Jan. 22, 1993 | [JP] | Japan | ................................. 5-009167 |
| Jun. 1, 1993 | [JP] | Japan | ................................. 5-130727 |

[51] Int. Cl.$^6$ ........................... H04L 27/14; H04L 27/16
[52] U.S. Cl. ........................ 375/326; 375/325; 375/340
[58] Field of Search ...................... 375/97, 94, 95, 375/96, 98, 75, 326, 316, 344, 342, 340, 343, 345, 325; 455/180.1, 182.1, 192.2, 234.1; 364/726

[56] References Cited

U.S. PATENT DOCUMENTS

| 4,562,582 | 12/1985 | Tokura et al. | ............................ 375/333 |
| 5,276,710 | 1/1994 | Iwasaki | ............................ 375/340 |
| 5,287,388 | 2/1994 | Ogura et al. | ............................ 375/97 |
| 5,367,539 | 11/1994 | Copley | ............................ 375/100 |

FOREIGN PATENT DOCUMENTS

| 0420192 | 4/1991 | European Pat. Off. . |
| 0433090 | 6/1991 | European Pat. Off. . |

OTHER PUBLICATIONS

"O db Eb/No Burst Mode SCPC Modem with High Coding Gain FEC" IEEE ICC'86 pp. 1792–1796.

*Primary Examiner*—Tesfaldet Bocure
*Attorney, Agent, or Firm*—Wolf, Greenfield & Sacks, P.C.

[57] ABSTRACT

A carrier detector which is capable of performing high-accuracy carrier detection even with patterns other than a CR pattern by processing signals on the frequency axis, regardless of the existence of the residual frequency due to the quasi-coherent detection. The carrier detector converts a received signal having been subject to the quasi-coherent detection, A/D conversion, filtering for eliminating noises and expressed on the time axis into that expressed on the frequency axis by the time axis/frequency axis converting circuit. An accumulator 2 accumulatively adds the signals expressed on the frequency axis, and a decision section compares the accumulated value output from the accumulator to a predetermined threshold to detect the coming of the burst so as to detect the carrier.

36 Claims, 42 Drawing Sheets

CARRIER DETECTOR

BACKGROUND OF THE INVENTION

1. Field of the Invention

The present invention relates to a carrier detector for detecting the coming of the burst and detecting a carrier, and a frequency controller using the same in a satellite communication and mobile communication system.

2. Description of the Related Art

In SCPC (Single Channel per Carrier) systems using voice activation, for example, a demodulator should perform a burst operation. There has been proposed a method for improving the burst operation of a demodulator by recognizing the coming of the burst through use of a carrier detector. FIG. 45 is a block diagram showing a conventional carrier detector described in "O db Eb/No Burst Mode SCPC Modem with High Coding Gain FEC" (IEEE, ICC '86 56.4). FIG. 46 is a flow diagram showing an operation of the detector shown in FIG. 45B. In FIG. 45B, the numerals designate respectively: 12, a voltage-controlled oscillator (hereinafter referred to as VCO); 13, a phase detector for comparing a phase of a received signal and a phase of an output of the VCO 12; 14, a PLL (Phase Locked Loop) circuit composed of an output from the VCO 12 and the phase detector 13; 15, a mixer for mixing the received signal and the output of the VCO 12; 16, an LPF for averaging noise in the output from the mixer 15; and 17, a square calculating section for calculating a square value of an output signal of the LPF 16.

The operation of this detector will now be described with reference to FIGS. 45A, 45B 46 and 47. FIG. 47 shows an example of a format of a burst signal to be received. In FIG. 47, the numerals designate respectively: 20, a pattern for a carrier recoverying (normally '11' or '00' pattern, hereinafter referred to as CR pattern); 21, a pattern for bit timing recoverying (normally '10' pattern, hereinafter referred to as BTR pattern); 22, a burst synchronization pattern called unique word (hereinafter referred to as UW pattern); 23, a data section for carrying data; 24, a non-signal section (noise only); 25, burst composed of the CR pattern 20, BTR pattern 21, UW pattern 22 and the data section 23. Since the carrier detector shown in FIG. 45 operates continuously, if the received signal is represented by s (t), this s (t) would receive the CR pattern, the BTR pattern, the UW pattern, the data section, and the non-signal section (noise only). But for simplification, in this case only the following three cases will be considered:

(a) CR pattern;

(b) Non-signal section (noise only); and (c) Data section.

For each of these three cases, the operation of the carrier detector will now be described. In this case, the UW pattern and the data section are supposed to be pseudo noise pattern (hereinafter referred to as PN pattern).

(a) Carrier only:

If the received signal is represented by s(t), and the output of the VCO 12 with the PLL 14 being locked is represented by V(t), s(t) and V(t) will be expressed as the following equations 1 and 2:

$$s(t)=\exp{(j2\pi\Delta ft)}+n(t) \quad (1)$$

Δf: carrier frequency
n(t): noise component $$V(t)=\exp{\{j2\pi\Delta ft+j\theta n(t)\}} \quad (2)$$

θe: steady state phase error
θn(t): phase jitter caused by noise

The mixer 15 multiplies s(t) with V(t), the product of which is passed through the LPF 16. The square calculating section 17 calculates the square z of the output r of the LPF 16 to provide power P(z) of z.

(b) Non-signal section (noise only)

The received signal s(t) can be represented by the equation 3:

$$s(t)=n(t) \quad (3)$$

With this s(t), the P(z) could be obtained in the same manner as in the case of (a).

(c) Data section:

The received signal s(t) is represented by the equation 4:

$$s(t)=\exp{\{-j(2\pi\Delta ft+D)\}}+n(t) \quad (4)$$

D: random variable representing phase modulation
With this s(t), the P(z) could be obtained in the same manner as in the case of (a).

The distribution of P(z) could be represented as in FIG. 45A, so it would be possible to detect the existence of the CR pattern by setting a suitable threshold from this FIG. 45. As a result, by comparison of the output P(z) of the square calculating section 17 with a threshold, it would be possible to detect the coming of the burst and to detect the carrier.

SUMMARY OF THE INVENTION

Since the conventional carrier detector is composed as mentioned above, there has been a drawback that if the difference between the frequency of the input signal and the frequency of the VCO is larger than the lock-in-range of the PLL, it becomes inoperative.

It is therefore an object of the present invention to carry out the carrier detection even when there is a large frequency offset in the received input signal or a residual frequency due to the quasi-coherent detection by processing the signals on the frequency axis.

In a carrier detector according to a first invention 1, a time axis/frequency axis converting circuit converts a coherent detection or quasi-coherent detection signal having been A/D converted and passed through a matched filter and expressed on a time axis into a signal expressed on a frequency axis, an accumulator calculates an accumulative value of an amplitude value or power of signals expressed on the frequency axis, and a decision section detects the coming of the burst by comparing the accumulative value to a threshold to detect carrier.

In a carrier detector according to a second invention, a multiplier multiplies a coherent or quasi-coherent detection signal having been A/D converted, passed through a matched filter and expressed on a time axis, a time axis/frequency axis converting circuit converts a signal expressed on the time axis into a signal expressed on the frequency axis, and a maximum value detector calculates and outputs a maximum value of an amplitude value or power of signals expressed on the frequency axis, and a decision section compares the maximum value to a threshold so as to detect a carrier.

In a carrier detector according to a third invention, a multiplier multiplies a frequency of a received signal, a time axis/frequency axis converting circuit converts the signal on the time axis into a signal on the frequency axis, an accumulator calculates an accumulative value of amplitude value or power of signals expressed on the frequency axis for each of several samples to output a plurality of accumulative values, a maximum value detector detects a maximum value of the output accumulative value, and a decision section compares the maximum value to a threshold to output a carrier detection signal.

In a carrier detector according to a fourth invention, a peak detector detects a plurality of peaks from amplitude values or powers of signals converted on the frequency axis, an accumulator calculates an accumulative value of amplitude values of powers of signals having the peak frequencies and signals of former or latter several samples thereof to output a plurality of accumulative values, a maximum value detector detects the maximum value, and a decision section compares the maximum value to a threshold to output a carrier detection signal.

In a carrier detector according to a fifth invention, a level detector detects a level of a received signal, a maximum value output from maximum value detector of the carrier detecting section according to the second through fourth inventions on the basis of the output signal from the level detector is controlled, and a decision section compares the maximum value to a threshold to output a carrier detection signal.

In a carrier detector according to a sixth invention, a frequency correcting circuit corrects the frequency of the received signal on the basis of the frequency information output from the carrier detection section.

In a carrier detector according to a seventh invention, a frequency interpolating circuit performs a frequency interpolation on the basis of the frequency obtained by a maximum value detector to improve the assuming accuracy of the frequency of the received signal.

In a carrier detector according to an eighth invention, a phase modulating signal being an output of an A/D converting means is expressed on a frequency axis, based on which a carrier is detected.

In a carrier detector according to a ninth invention, a received signal expressed on a time axis is expressed on a frequency axis, and an accumulative value of an amplitude value or power of the signal expressed on the frequency axis is calculated. This accumulative value is compared to a predetermined threshold, and a carrier detection signal is output on the basis of the compared result.

In a carrier detector according to tenth invention, the coming of the burst is detected when an accumulative value exceeds a threshold.

In a carrier detector according to eleventh invention, a received signal expressed on a time axis is multiplied by a predetermined value. The received signal is expressed on the frequency axis, and a signal having a larger amplitude value or power among the signals expressed on the frequency axis is detected. This detected value is compared to a predetermined threshold, and a carrier detection signal is output used on this compared result.

In a carrier detector according to twelfth invention, the coming of the burst is detected when the value detected by the detector exceeds a threshold.

In a carrier detector according to thirteenth invention, a received signal expressed on a time axis is multiplied by a predetermined value. The multiplied received signal is expressed on a frequency axis, and an accumulative value of the amplitude value or power expressed on the frequency axis is output on the basis of predetermined unit. An accumulative value of a larger value among the accumulative values is output to be compared to a predetermined threshold, and a carrier detection signal is output on the basis of the compared result.

In a carrier detector according to fourteenth invention, the coming of the burst is detected when the value detected by the detector exceeds a threshold.

In a carrier detector according to fifteenth invention, a correlation of a received signal to a reference signal is calculated on the basis of a calculation of a phase of the received signal expressed on a time axis and a phase of the reference signal having been previously stored. A value having a larger correlation is output to be compared to a predetermined threshold, and a carrier detection signal is output on the basis of this compared result.

In a carrier detector according to sixteenth invention, a power level of a carrier component is adjusted on the basis of an output signal of a level detector.

In a carrier detector according to seventeenth invention, the frequency is corrected on the basis of a frequency of the signal received by the detector.

In a carrier detector according to eighteenth invention, a frequency is corrected on the basis of a frequency of a signal received by a detector and a carrier detection signal.

In a carrier detector according to nineteenth invention, in a correlator, a phase component of the received signal and a correlation of the received signal to a reference signal are calculated, and a decision section compares the correlation to a threshold to obtain the carrier.

In a carrier detector according to twelfth invention, a carrier is detected when a value detected by a detector exceeds a threshold.

In a carrier detector according to claim 21 of the present invention, a carrier is detected by calculating a reliability of a correlation obtained in a reliability calculating section and eliminating correlations of low reliability.

In a carrier detector according to claim 22 of the present invention, a frequency of the received signal is corrected by a frequency correcting circuit for correcting a frequency of the received signal on the basis of the frequency information of the correlator.

In a carrier detector according to claim 23 of the present invention, the carrier component calculating section calculates a difference between a phase of the received signal and the phase of the previously received signal and calculates a carrier component using the phase difference, and the decision section detects the carrier by comparing the carrier component to the threshold.

In a carrier detector according to claim 24 of the present invention, the differential detection is carried out by use of the received signal, and the carrier is detected by calculating the carrier component using the result of the differential detection.

In a carrier detector according to claim 25 of the present invention, the level of the carrier component calculating section is adjusted on the basis of the output signal from the level detector.

In a carrier detector according to claim 26 of the present invention, the frequency of the received signal is corrected on the basis of the frequency information output from the carrier component calculating section.

In a carrier detector according to claim 27 of the present invention, the carrier is detected with improved accuracy by providing a correlation interpolating circuit for performing the interpolation for the correlation.

The above and other advantages, features and additional objects of this invention will be manifest to those versed in the art upon making reference to the following detailed description and the accompanying drawings in which a structural embodiment incorporating the principles of the present invention is shown by way of illustrative example.

DETAILED DESCRIPTION OF THE PREFERRED EMBODIMENT

The method described here is typically applicable to a waveform modulated by M-phase PSK. Hereafter, the term "received signal" not particularly specified stands for a signal that has been subject to a coherent or quasi-coherent detection and A/D conversion, then modulated by M-phase PSK having been made noise-free by filtering, and expressed on the time axis. Major frequency offset in the received input signal or the residual frequency due to the quasi-coherent detection is simply called "frequency offset". It is assumed that the bursts are not synchronized, the time of the coming of the burst is unpredictable (the burst may come at any time), and that the carrier detector operates in the continuous mode until the carrier is detected.

In the 1st through the 19th Embodiments, although the frequency offset may be calculated by a carrier component calculating section using amplitude of signals having been expressed on the frequency axis/frequency axis converting circuit, a case of performing Discrete Fourier Transform (hereinafter referred to as DFT. FFT included) will be exemplified. In these embodiments, further, the burst is assumed to have a Pseudo Noise pattern (hereinafter referred to as PN pattern).

In the 20th through 25th Embodiments, the carrier detector identifies burst by detecting a non-modulating pattern (hereinater referred to CR pattern). In regard to the portions to be subject to the differential detection, only a case of performing the differential detection on a one-sample previous signal will be described, for simplification.

First Embodiment

Figure 1:
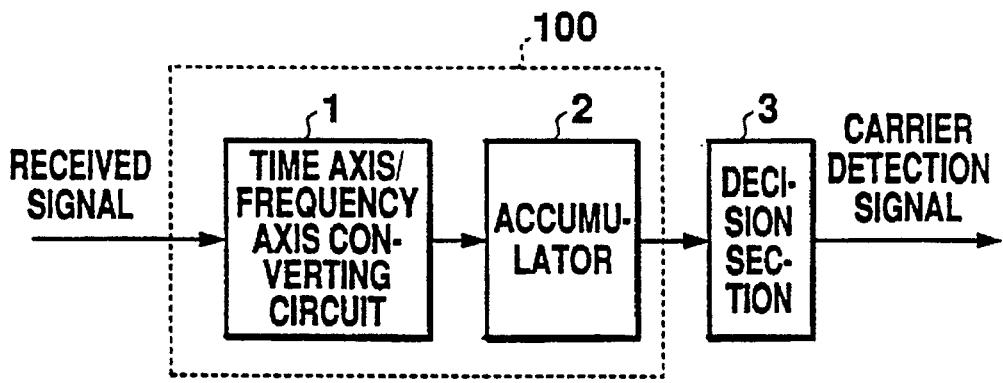
FIG. 1 is a block diagram showing a carrier detector according to the first embodiment of the present invention.
Figure 2:
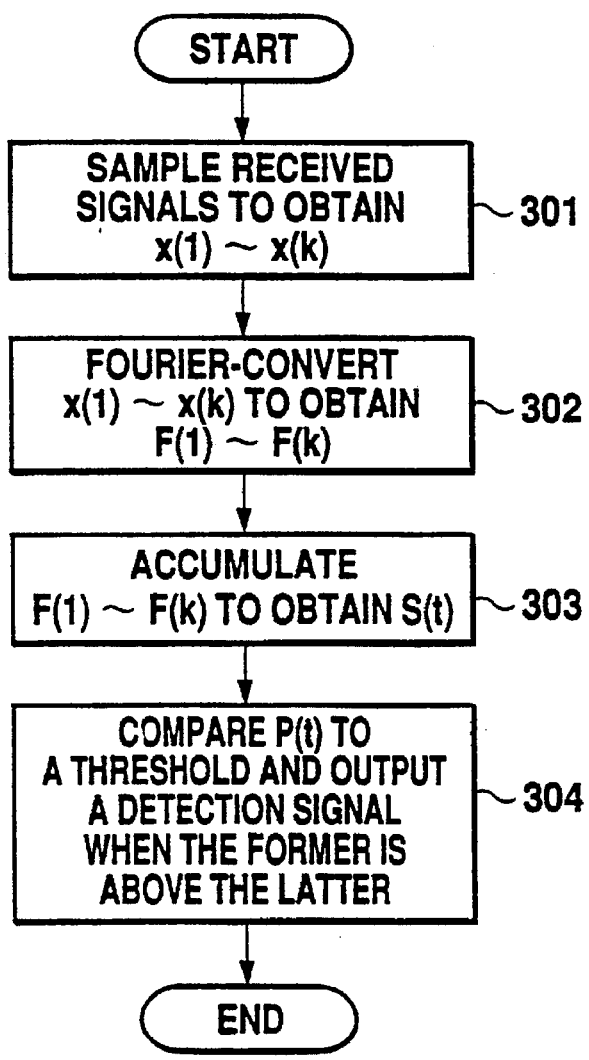
FIG. 2 is a flow diagram showing operation of the detector shown in FIGS. 1 and 19.
Figure 3:
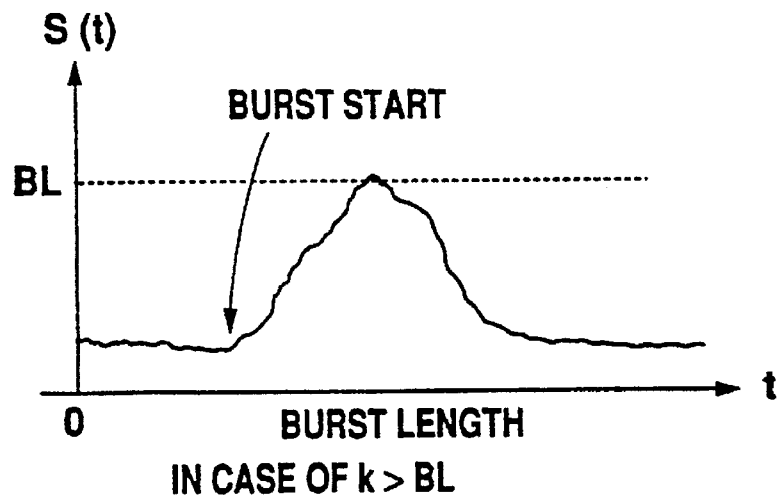
FIG. 3 is an example of the total power of the received signal output from an accumulator.
Figure 4:
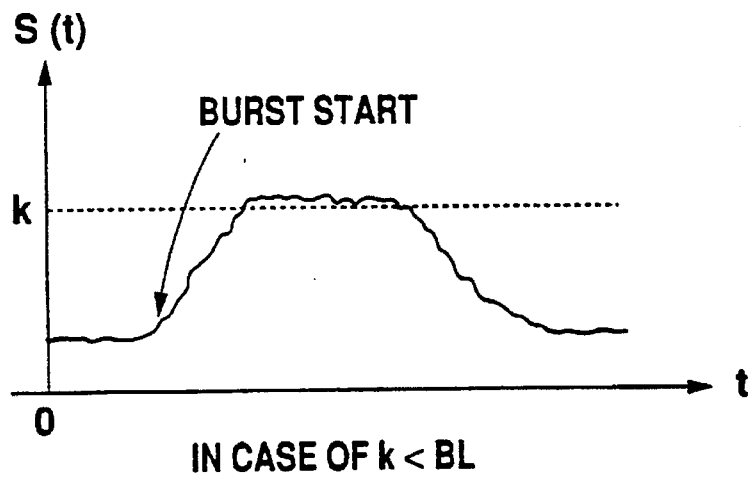
FIG. 4 is an example of the total power of the received signal output from an accumulator shown in FIGS. 1 and 19.

FIG. 1 is a block diagram showing a carrier detector according to a first embodiment of this invention, FIG. 2 is a flow diagram showing operation of the detector in FIG. 1, and FIGS. 3 and 4 show total power of a received signal output from an accumulator.

In FIG. 1, the numerals designate respectively: 1, a time axis/frequency axis converting circuit for converting a received signal expressed on the time axis into expressed on the frequency axis; 2, an accumulator for calculating an accumulative value of the power spectrum of a signal expressed on the frequency axis; 100, a carrier detecting section composed of the time axis/frequency axis converting circuit 1 and the accumulator 2; 3, a decision section for detecting a coming of the burst by comparing an accumulative value output from the carrier detecting section 100 to a threshold, detecting carrier, and outputting a carrier detection signal when the carrier is detected.

The received signal is designated as s(t). In view of a total accumulated power spectrum of received signals, while noise power is obtained in the case of lacking burst, (noise+signal) power is obtained when burst exists. Therefore, the total power with burst would be larger than that without burst. The burst detection using this principal will now be considered. Successive k (number) of sample data are taken out for each or several samples having been sampled by A/D conversion, these data being designated x(1)–x(k) (301). These k signals are then subject to DFT and squared to provide a power spectrum of s(t), so as to render k signals F(1)–F(k) expressed on the frequency axis (302). Further, a total power of s(t) is calculated by accumulating the F(1)–F(k) (303). If the total power of s(t) is expressed as S(t) with the burst length BL, the S(t) will be varied as shown in FIGS. 3 and 4, for example. Accordingly, it is possible to detect the coming of the burst (304) and the carrier by reducing the false detection probability due to noise, setting a proper threshold to reduce the miss detection probability, and comparing the S(t) to the threshold.

The carrier detector according to the first embodiment will now be described. The time axis/frequency axis converting circuit 1 performs DFT for the received signal and squares it to provide a power spectrum of s(t) so as to render k signals F(1)–F(k) expressed on the frequency axis. The accumulator 2 accumulatively adds the F(1)–F(k) to provide a total power S(t) of the s(t). The decision section 3 compares S(t) to the threshold, and detects that a burst has come when S(t) exceeds the threshold to output a carrier detection signal.

Second Embodiment

Figure 5:
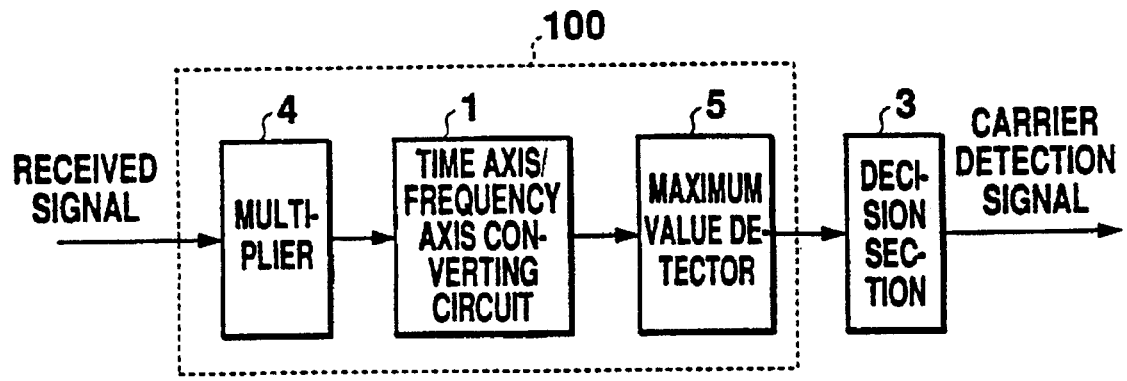
FIG. 5 is a block diagram showing a carrier detector according to the second embodiment of the present invention.
Figure 6:
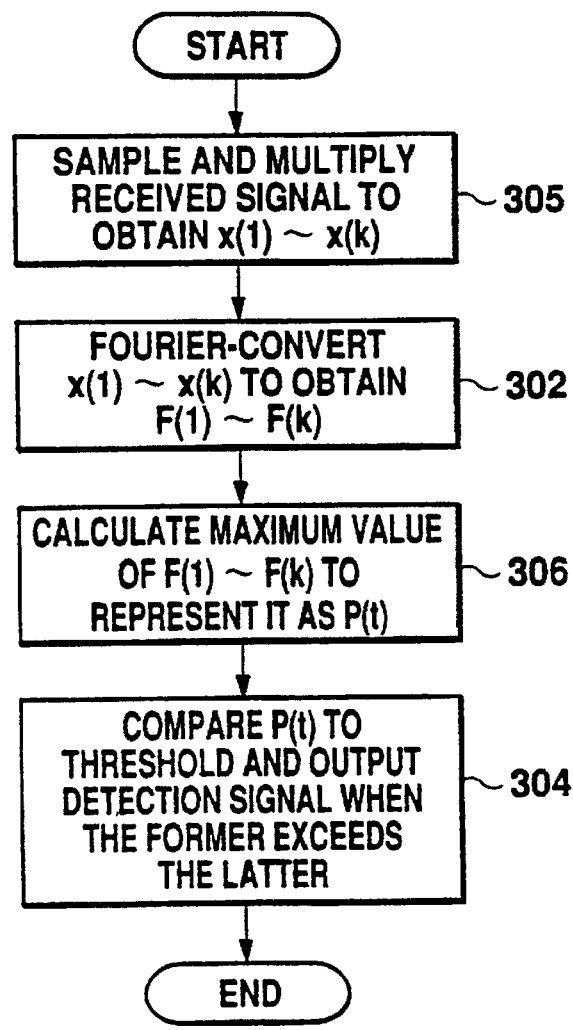
FIG. 6 is a flow diagram showing operation of the detector shown in FIGS. 5 and 20.

FIG. 5 is a block diagram showing a carrier detector according to the second embodiment of this invention, and FIG. 6 is a flow diagram showing operation of the detector in FIG. 5.

In FIG. 5, the numerals designate respectively: 4, a multiplier for multiplying the received signal; 1, the same time axis/frequency axis converting circuit as in the first embodiment; 5, a maximum value detector for calculating the maximum value of the power spectrum expressed on the frequency axis; 100, a carrier detecting section composed of the multiplier 4, the time axis/frequency axis converting circuit 1, and the maximum value detector 5; 3, the same decision section as in the first embodiment.

In the case of no noise, the received signal s(t) would be expressed only by the frequency offset in the received input signal and the modulating component due to the transmission data, as represented by the equation 5:

$$s(t) = \exp\{-j(2\pi\Delta ft + \theta e)\} * \exp(-j\theta(t)) \quad (5)$$

$\theta(t)$: modulating component due to data which is expressed as $\theta(t) = 2\pi * m/M$ (m=0, 1, ..., M−1). At time t, m would correspond to any of 0–M−1 in accordance with the transmission data.

$\Delta f$: frequency offset $\theta e$: initial phase difference due to the frequency offset.

If this s(t) is multiplied by M, the resulting output is expressed as sM(t), and this sM(t) would be expressed as:

$$\begin{aligned} sM(t) &= \exp\{-j(M2\pi\Delta ft + M\pi e)\} * \exp(-jM\theta(t)) \quad (6) \\ &= \exp\{-j(M2\pi\Delta ft + M\theta e)\} * \\ &\quad \exp(-jM * 2\pi * m/M) \\ &= \exp\{-j(M2\pi\Delta ft + M\theta e)\} * \exp(-j * 2\pi * m) \\ &= \exp\{-j(M2\pi\Delta ft + M\theta e)\}. \end{aligned}$$

Thus, the modulating component of the transmission data is eliminated, and only the frequency offset multiplied by M and the initial phase difference remain. By applying DFT and squaring to this sM(t), F(1)–F(k) are obtained. When the power spectrum expressed by the equation 6 is observed on the frequency axis, a line spectrum should appear at M$\Delta f$. However, actually the spectrum would become expanded due to the pattern jitter caused by the data pattern. Accordingly, if the frequency observable by F(1)–F(k) is called frequency observing point, the power spectrum at M$\Delta f$ or at the frequency observing point nearest thereto would be maximum.

In view of the above, with a maximum value of F(1)–F(k) at the time t being calculated and designated as P(t), if in the case of noise only, the values of F(1)–F(k) would be the same. However, if there is a burst, peaks of F(1)–F(k) would become imposing at M$\Delta f$ or the frequency observing points nearest thereto. Here, since P(t) would be varied in the same manner as S(t) shown in FIGS. 3 and 4, it is possible to detect the coming of the burst and to detect the carrier by setting a proper threshold and comparing the threshold to P(t).

Accordingly, the multiplier 4 multiplies the received signal by M to remove the modulating component, and the time axis/frequency axis converting circuit 1 performs DFT and squaring operation in the same manner as in the first embodiment to provide F(1)–F(k). The maximum value detector 5 functions in the same manner as in the first embodiment to output P(t). The decision section 3 compares P(t) to the threshold, and detects that the burst has come when the P(t) exceeds the threshold to output the carrier detection signal.

In the second embodiment, when MΔf does not accord with the frequency observing point, the power spectrum would be dispersed to two frequency observing points with the MΔf therebetween. Therefore, the detected maximum value would be observed with an undesirably lower maximum value than its correct maximum value. Thus, the possibility of false detection or miss detection would be raised. To cope with such a problem, the estimation error of the MΔf and the frequency observing point should be reduced, namely, it would be solved by reducing the frequency resolution by the DFT. For simplification, X (number) of s(t) is sampled for one symbol, and DFT is carried out using data x(1)–x(k) (k=X*L) for L symbols. With the symbol period being T and the sampling interval being Δt, the following equation could be formed:

$$\Delta t = T/X \quad (7)$$

Further, with the frequency resolution by DFT as Δfr, $$\Delta fr = 1/(\Delta t * k) = X/(T * k) \quad (8)$$
$$= X/(T * X * L) = 1/(T * L)$$

Accordingly, an increased number of symbols to be processed would reduce the resolution to improve the carrier detecting accuracy.

Third Embodiment

Figure 7:
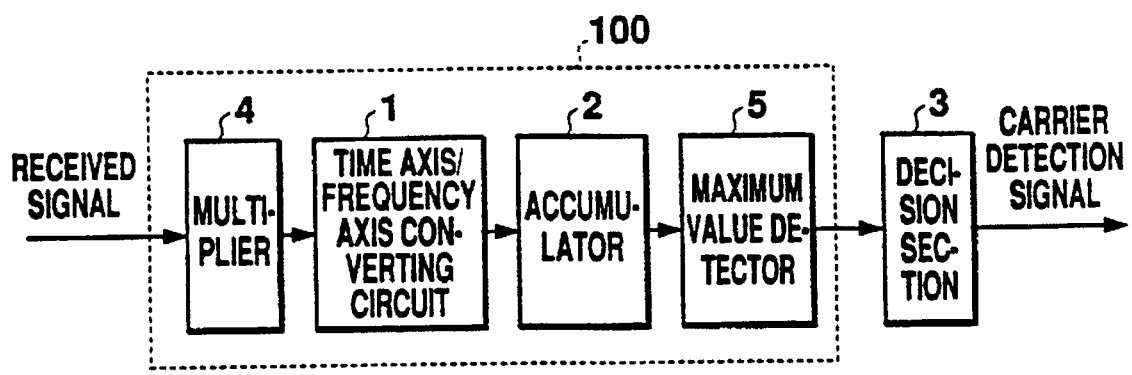
FIG. 7 is a block diagram showing a carrier detector according to the third embodiment of the present invention.
Figure 8:
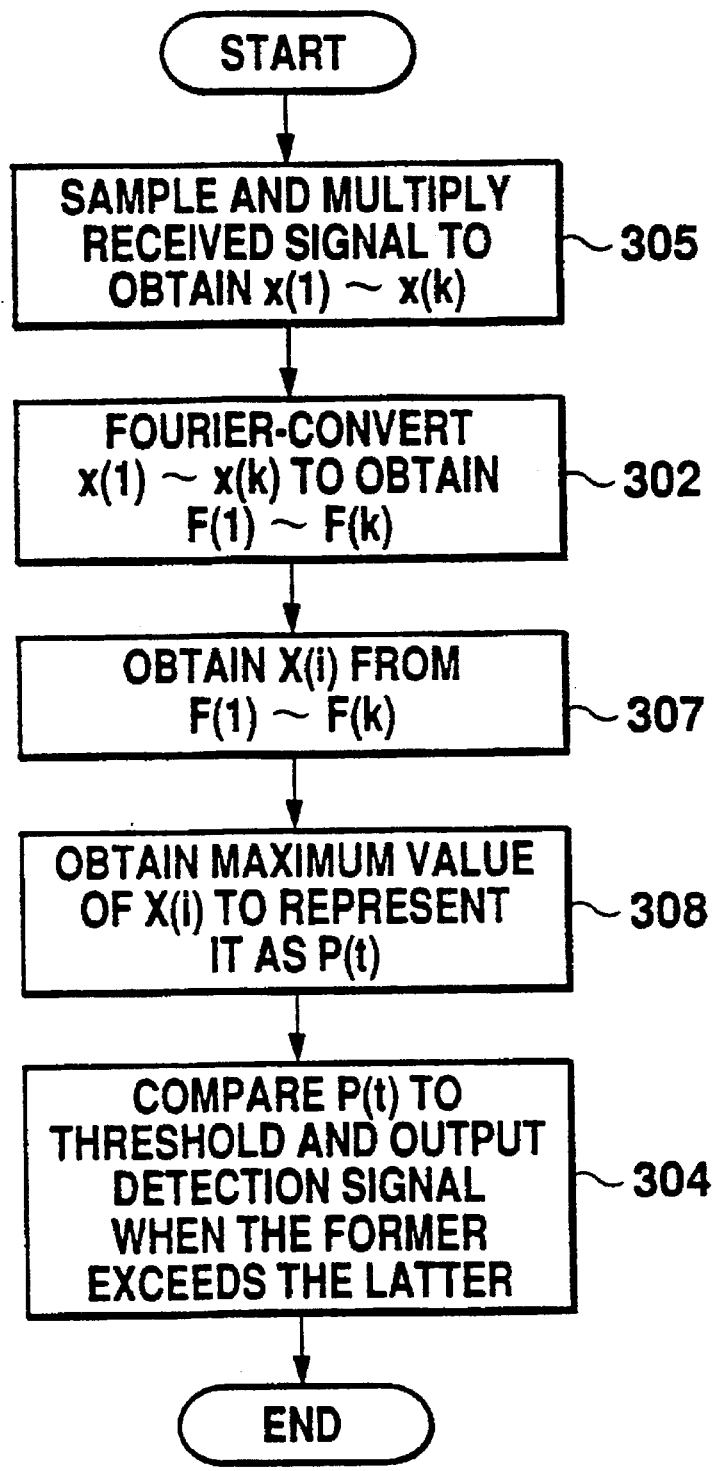
FIG. 8 is a flow diagram showing operations of the detectors shown in FIGS. 7 and 21.

FIG. 7 is a block diagram showing a carrier detector according to the third embodiment of the present invention, and FIG. 8 is a flow diagram showing operation of the detector in FIG. 7.

In FIG. 7, the numerals designate respectively: 4 and 1, a multiplier and a time axis/frequency axis converting circuit likewise in the first embodiment; 2, an accumulator for calculating accumulative value of the power spectrum of the signal expressed on the frequency axis; 5, a maximum value detector for obtaining the maximum one of a plurality of accumulative value output from the accumulator 2; 100, a carrier detecting section composed of the multiplier 4, the time axis/frequency axis converting circuit 1, the accumulator 2 and the maximum value detector 5. The decision section 3 is the same as that in the first embodiment.

When the power spectrum of s(t) is observed on the frequency axis, a line spectrum should theoretically appear at MΔf. Actually, however, spectrums appear at positions other than MΔf due to the influence of noise and pattern jitter. Since F(1)–F(k) are dispersed on the frequency axis with an interval of Δfr, the power spectra at the frequency observing points corresponding to MΔf or at frequency observing points nearest to MΔf are detected.

As aforementioned, when MΔf is not accorded with the frequency observing points, the detected maximum value would be observed with an undesirably lower maximum value than the correct maximum value of the signal. In the worst case, the peak would be reduced by 3.9 dB. As a result, the possibility of false detection or miss detection would be raised. To cope with such a problem, the accumulated value of the power spectrum is calculated for every several samples, and that of the maximum value is detected from a plurality of accumulated values, and a carrier is detected using the maximum value. By detecting the accumulated value of the power spectrum for every continuous several samples, it becomes possible to obtain the carrier power even when MΔf does not accord with the frequency observing point. For example, if the ith accumulated value of the power spectrum of the signal at a point with m samples forward and backward thereof is expressed as X(i), this X(i) could be represented by the equation (9), and that having the maximum value of X(i) is selected from (k–2m) accumulated values.

$$X(i) = \sum_{L=-m}^{m} F(i+L) \quad (9)$$

$$(1 + m \leq i \leq k - m)$$

Therefore, the multiplier 4 and the time axis/frequency axis converting circuit 1 multiplies the received signal by M to remove the modulating component as in the first embodiment, and carry out DFT and squaring operation on the multiplied signal to provide F(1)–F(k). The accumulator 2 acts to calculate X(i) shown by the equation 9. The maximum value detector 5, in the same manner as in the first embodiment, outputs the maximum value of X(i) as P(t). The decision section 3 compares P(t) to the threshold, and detects that burst has come when P(t) exceeds the threshold to output the carrier detection signal.

Fourth Embodiment

Figure 9:
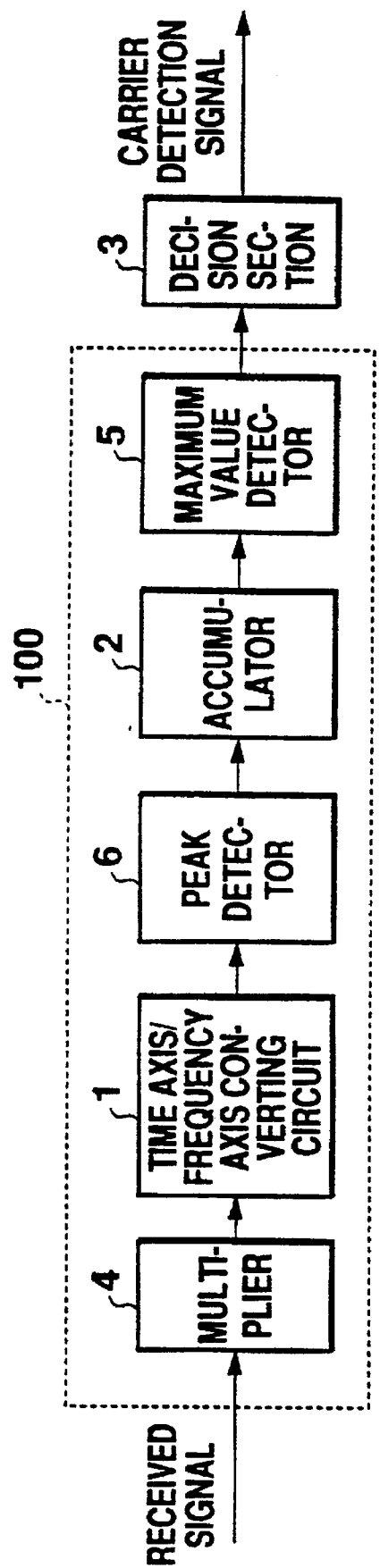
FIG. 9 is a block diagram showing a carrier detector according to the fourth embodiment of the present invention.
Figure 10:
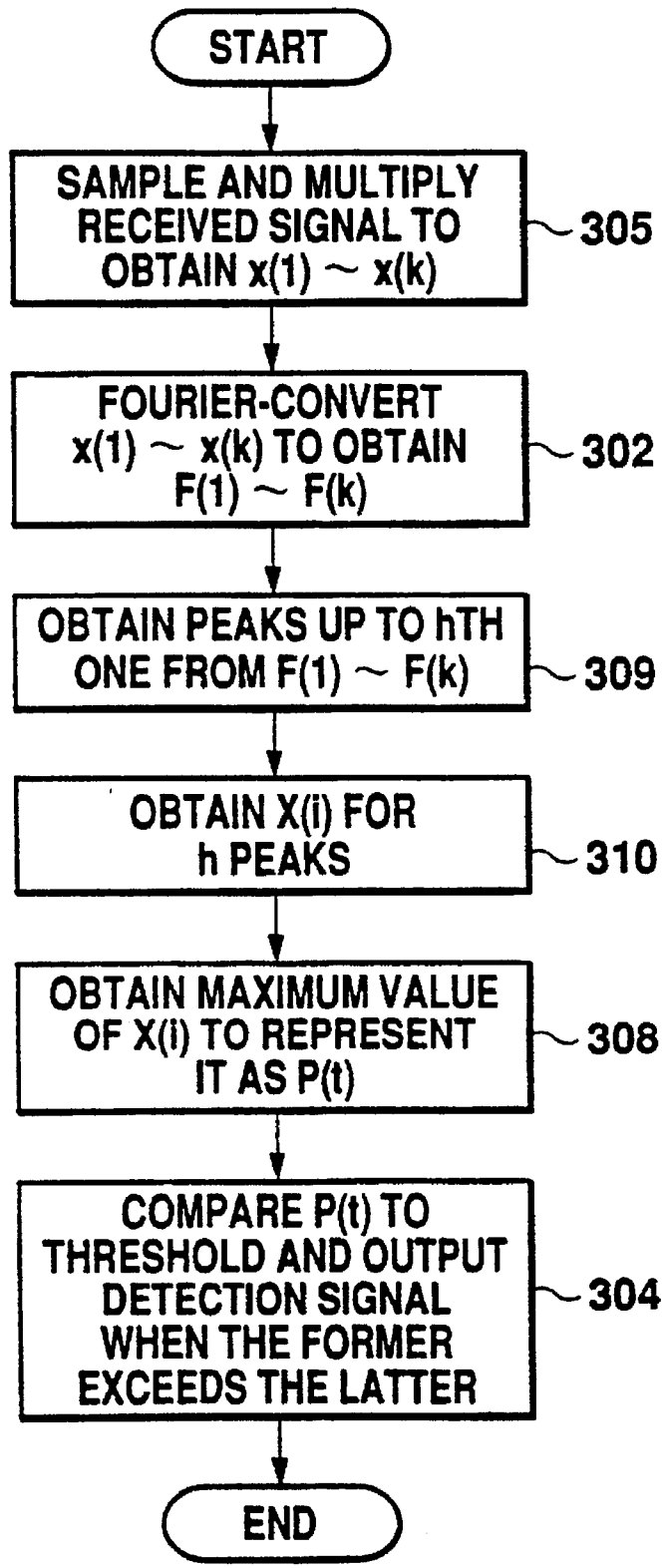
FIG. 10 is a flow diagram showing operations of the detectors shown in FIGS. 9 and 22.

FIG. 9 is a block diagram showing a carrier detector according to the fourth embodiment of the present invention, and FIG. 10 is a flow diagram showing the operation of FIG. 9.

In FIG. 9, the numerals designate respectively: 4 and 1, a multiplier and a time axis/frequency axis converting circuit 1 respectively as in the first embodiment; 6, a peak detector for detecting a plurality of larger peaks in order among power spectra of signals expressed on the frequency axis; 2, an accumulator for calculating an accumulative value of power spectra at former and latter several samples respectively of a frequency observing point being a peak output from the peak detector 6; 5, a maximum value detector for detecting themaximum value from a plurality of accumulative values output from the accumulator 2; 100, a carrier detecting section composed of the multiplier 4, the time axis/frequency axis converting circuit 1, the peak detector 6, the accumulator 2 and the maximum value detector 5. The decision section 3 is the same as that in the first embodiment.

In the third embodiment, the accumulated value is calculated for every observed region to provide X(i). But if the value of X(i) becomes large at the positions other than MΔf, in most cases there is a peak exceeding the mean of F(i) in F(i) (1≦i≦k) due to the noise. Therefore, an accumulated value of the power spectra for all the observing regions need not be calculated. In this case, peaks from the top down to that of the "h" th one are detected, X(i) is calculated for these h peaks, and the maximum value for X(i) is designated as P(t).

Accordingly, the multiplier 4 and the time axis/frequency axis converting circuit 1 would multiply the received signal by M to remove the modulating component, apply DFT and a squaring operation to the multiplied signals to provide F(1)–F(k). The peak detector detects a plurality of peaks in order from the largest one of F(1)–F(k), and the accumulator 2 calculates X(i) expressed by the equation 9 for these peaks in the same manner as in the third embodiment. The maximum value detector 5, likewise to the third embodiment, outputs the maximum value of X(i) at the time t as P(t). The decision section 3 compares P(t) to a threshold, and detects that the burst has come to output a carrier detection signal if P(t) exceeds the threshold.

Fifth Embodiment

Figure 11:
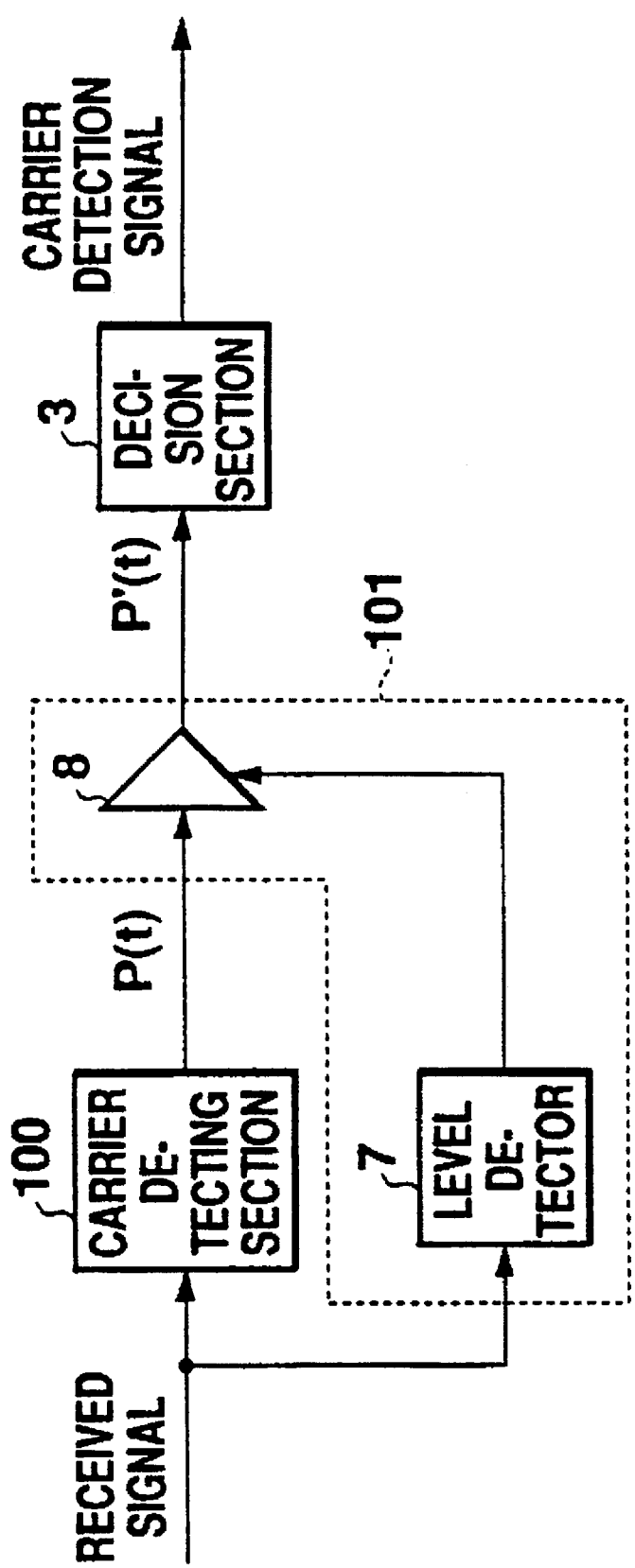
FIG. 11 is a block diagram showing a carrier detector according to the fifth embodiment of the present invention.
Figure 12:
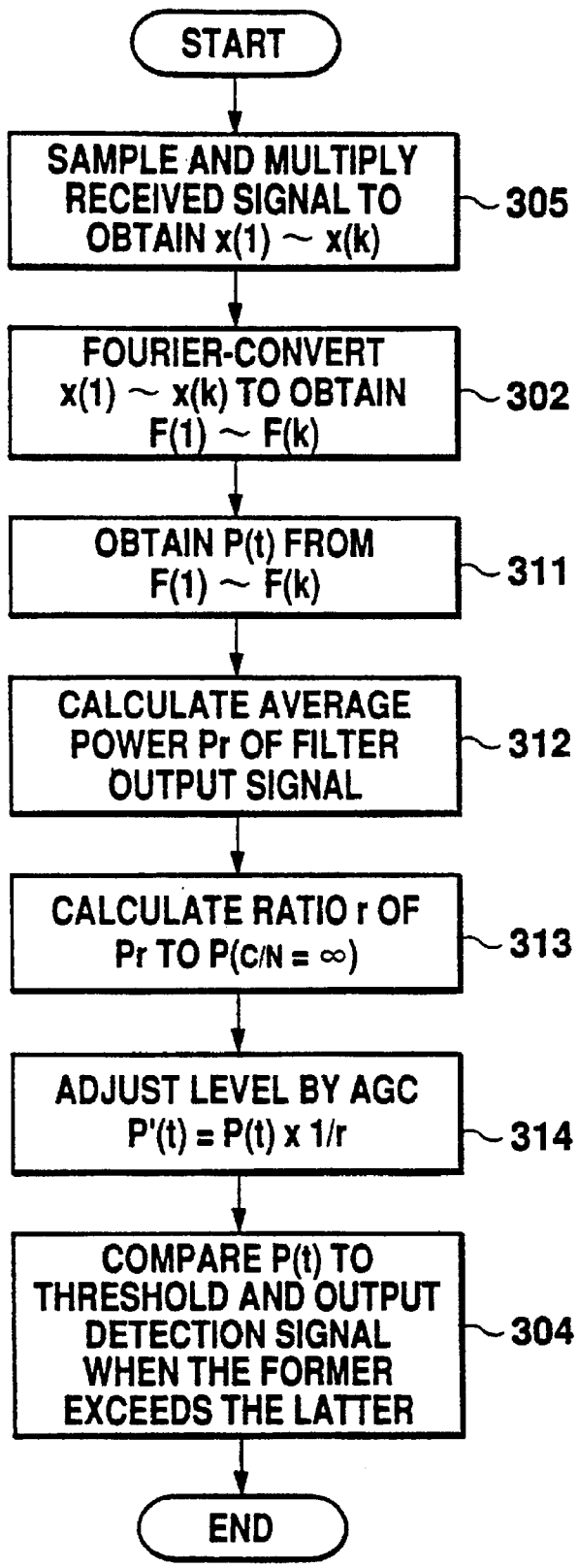
FIG. 12 is a flow diagram showing operations of the detectors shown in FIGS. 11 and 23.

FIG. 11 is a block diagram showing a carrier detector according to a fifth embodiment of the present invention, FIG. 12 is a flow diagram showing operation of the detector in FIG. 11.

In FIG. 11, the numerals designate respectively: 3 and 100, a decision section and a carrier detecting section as in the second—fourth embodiments; 7, a level detector for detecting the level of the received signal; 8, an ACG (Automatic Gain Control) amplifier for adjusting the level of P(t) output from the carrier detecting section 100; 101, an ACG circuit composed of the level detector 7 and the ACG amplifier 8.

While in the decision section in the second—fourth embodiments, the carrier has been detected when the P(t) exceeds the threshold, so the detecting operation would be affected by the level of the input signal. Therefore, it will now be considered to apply AGC to the received signal on the basis of the detected level thereof, and to compensate for the level of the P(t) output from the carrier detecting section. An example of AGC is shown below.

The carrier detecting section 100 operates in the same manner as in the second—fourth embodiments to output P(t). The level detector 7 samples the received signal to calculate an average power Pr of the received signal on the time axis, and further calculates a ratio r of Pr to the power P at C/N=∞.

$$r=Pr/P(C/N=\infty) \qquad (10)$$

The time constant for calculating the average power Pr is selected to sufficiently average the level fluctuation of the signal due to the phasing etc. The AGC amplifier 8 uses an output P(t) of the carrier detecting section 100 and the output r of the level detector 7 to meet the following condition, thereby rendering P'(t):

$$P'(t)=P(t)\times 1/r \qquad (11)$$

The decision section 3, in the same manner as in the second—fourth embodiments, compares P'(t) to a threshold to detect the carrier.

Sixth Embodiment

Figure 13:
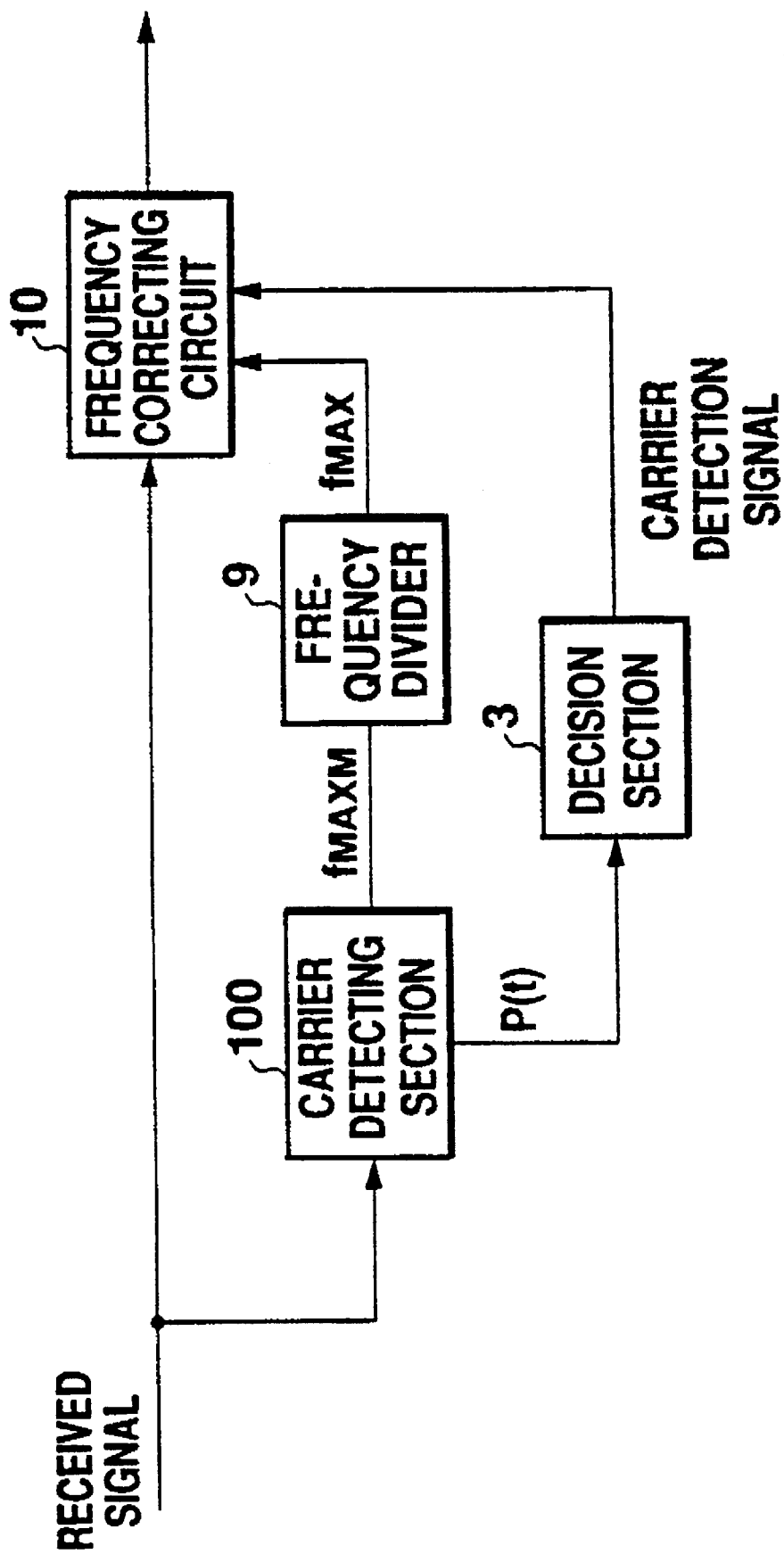
FIG. 13 is a block diagram showing a carrier detector according to a sixth embodiment of the present invention.
Figure 14:
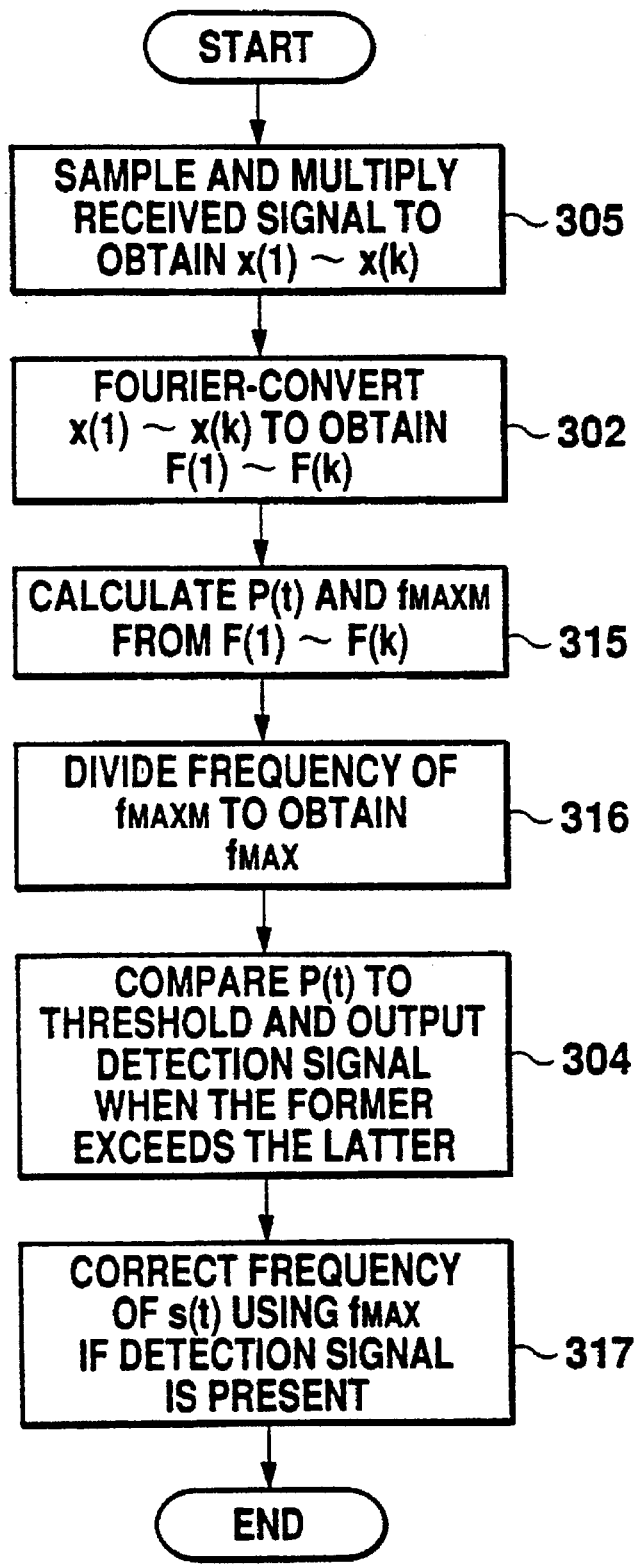
FIG. 14 is a flow diagram showing operations of the carrier detectors shown in FIGS. 13 and 24.

FIG. 13 is a block diagram showing a carrier detector according to a sixth embodiment of the present invention, FIG. 14 is a flow diagram showing operation of the detector in FIG. 13.

In FIG. 13, the decision section 3 functions in the same manner as in the second—fourth embodiments. The carrier detecting section 100 operates in the same manner as in the second—fourth embodiments, and outputs a frequency to maximize the power spectrum (hereinafter referred to as $f_{MAXM}$). In FIG. 13, the numerals designate respectively: 9, a frequency divider for dividing the $f_{MAXM}$ by M to output a frequency offset (hereinafter referred to as $f_{MAX}$); 10, a frequency correcting circuit for correcting the frequency of the received signal using the $f_{MAX}$ output from the frequency divider 9.

The carrier detecting section 100 detects and outputs P(t). But since the frequency offset $f_{MAX}$ can be simultaneously obtained here, it will now be considered to apply AFC (Automatic Frequency Control) to the received signal using $f_{MAX}$. The carrier detecting section 100, in the same manner as in the second—fourth embodiments, outputs P(t). If the frequency corresponding to this P(t) is represented as $f_{MAXM}$ in view of the results from the second—fourth embodiments, $f_{MAXM}$ is a frequency offset multiplied by M, so that $f_{MAXM}$ is divided by M to render a frequency offset $f_{MAX}$. With the frequency offset being $f_{MAX}$, the application of AFC would be carried out by shifting the frequency of the received signal by $-f_{MAX}$ in the frequency correcting circuit.

Seventh Embodiment

Figure 15:
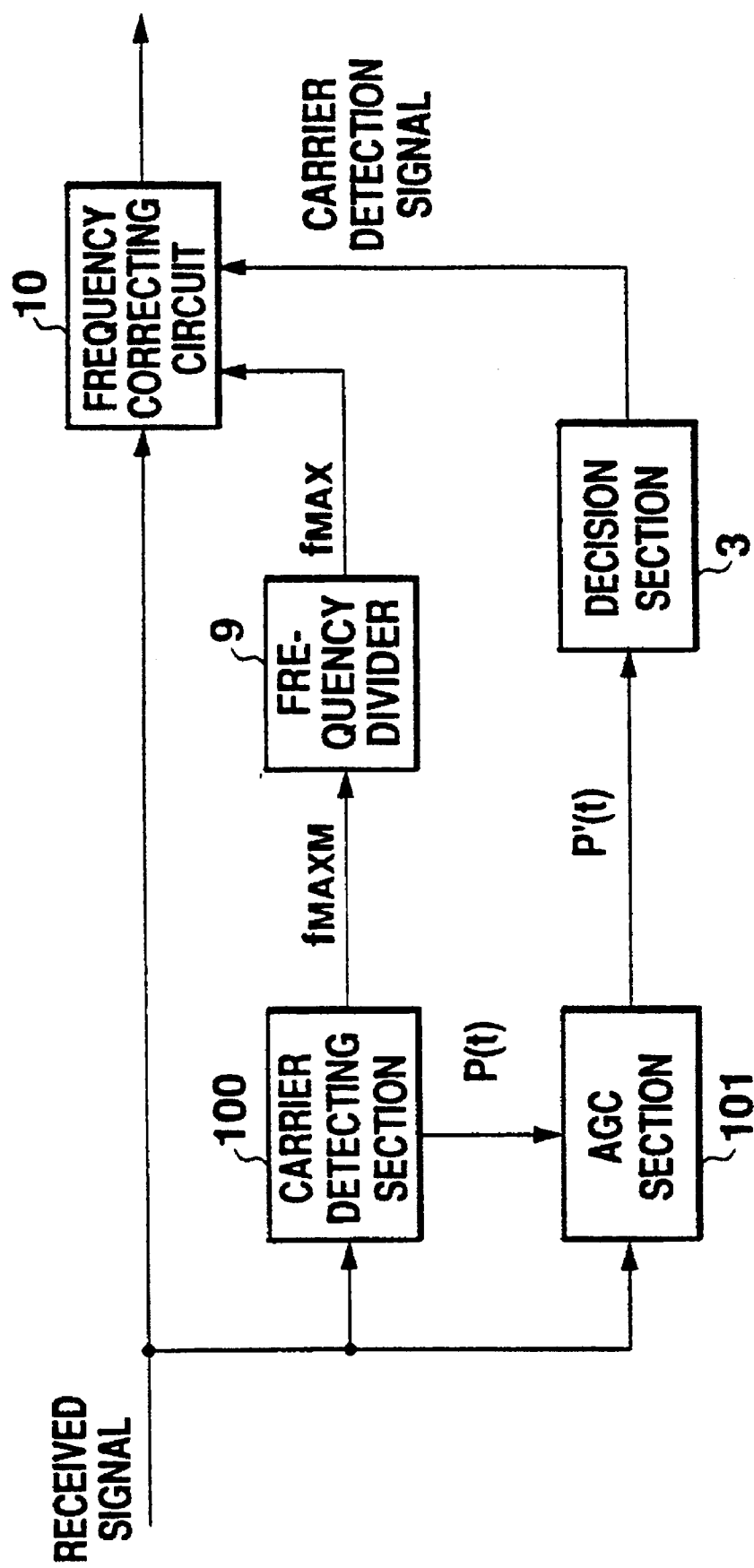
FIG. 15 is a block diagram showing a carrier detector according to the seventh embodiment of the present invention.
Figure 16:
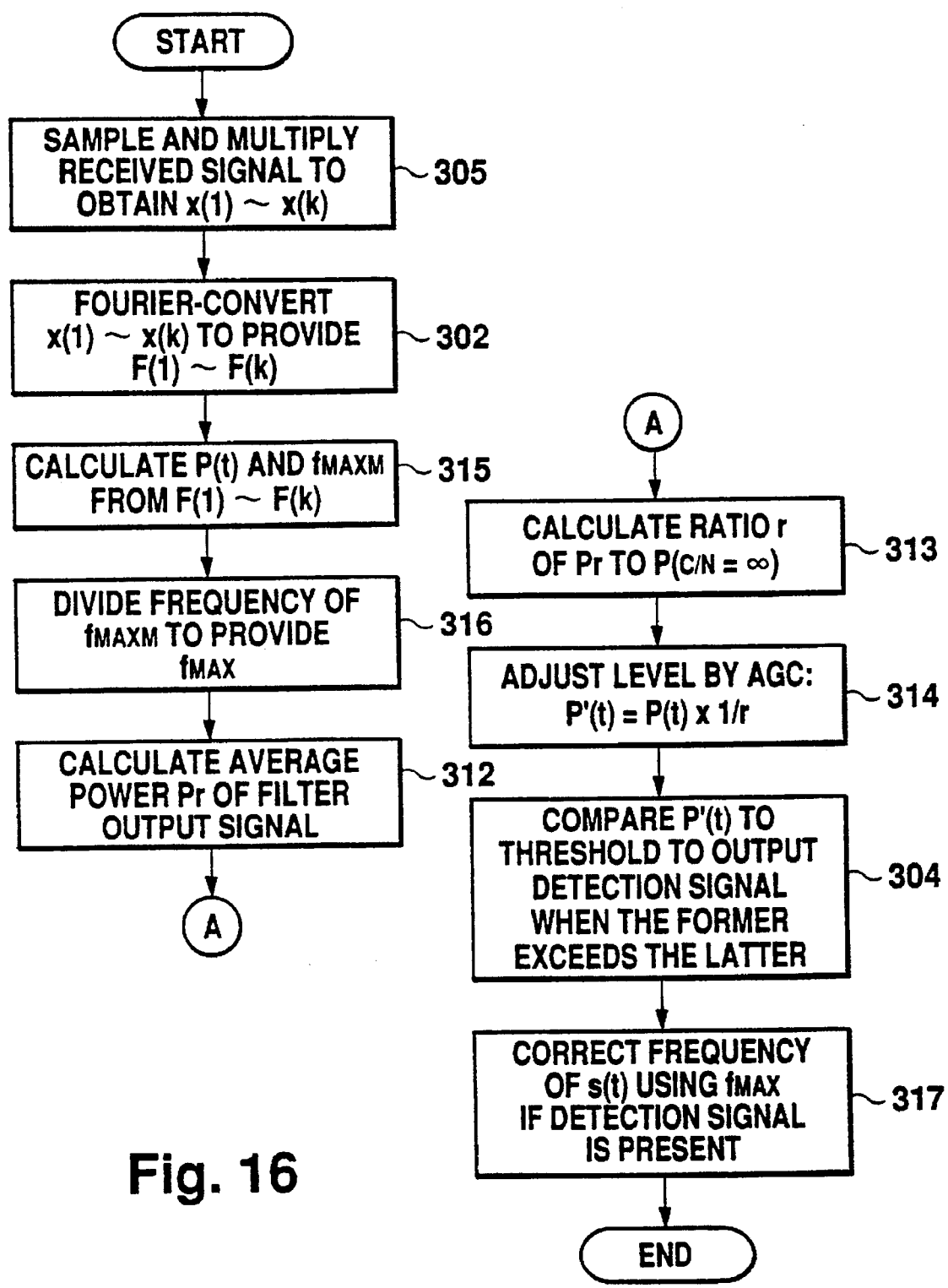
FIG. 16 is a flow diagram showing operations of the detectors shown in FIGS. 15 and 25.

FIG. 15 is a block diagram showing a carrier detector according to a seventh embodiment of this invention, and FIG. 16 is a flow diagram showing operation of the detector in FIG. 15.

In FIG. 15, the carrier detecting section 100, the AGC section 101, and the decision section 3 are the same as those in the fifth embodiment, and the frequency divider 9 and the frequency correcting circuit 10 are the same as those in the sixth embodiment.

The operation of the detector according to this embodiment will now be described. The detecting section 100 and the AGC section 101 operate to detect carrier in the same manner as in the fifth embodiment, and the frequency divider 9 and the frequency correcting circuit 10 operate to correct the frequency of the received signal and output a correcting signal in the same manner as in the sixth embodiment.

Eighth Embodiment

Figure 17:
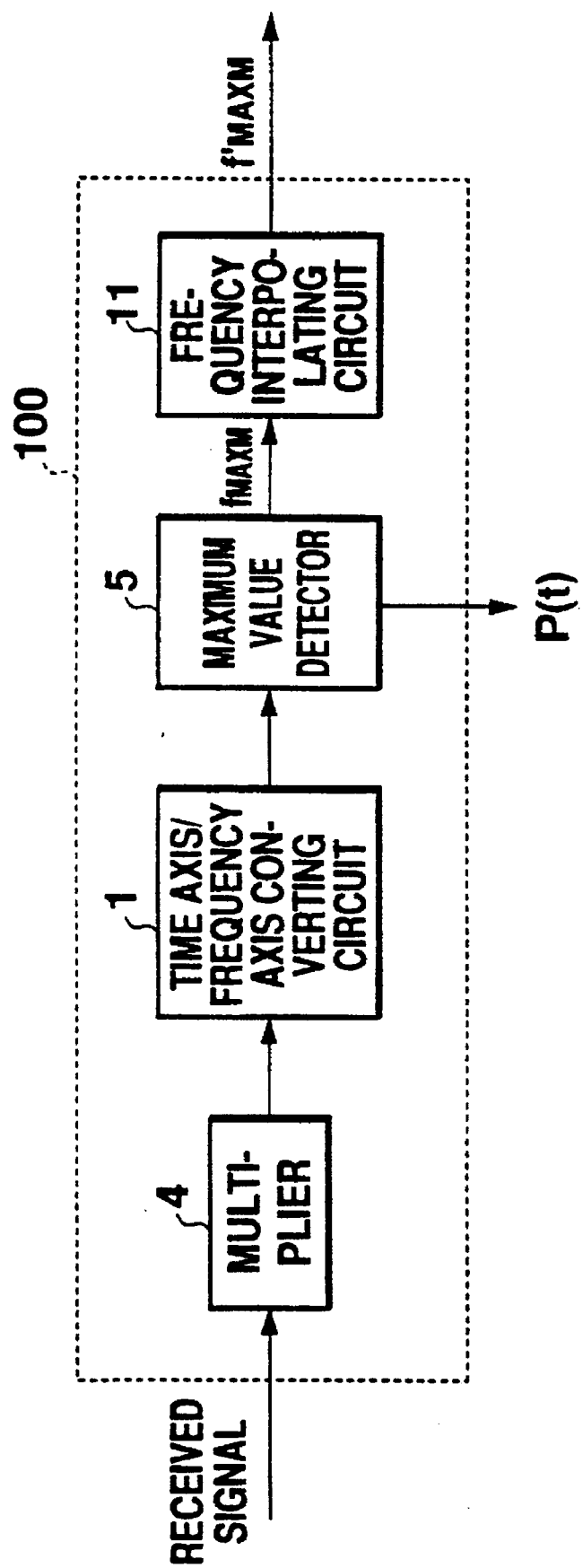
FIG. 17 is a block diagram showing a carrier detecting section according to an eighth embodiment of the present invention.
Figure 18:
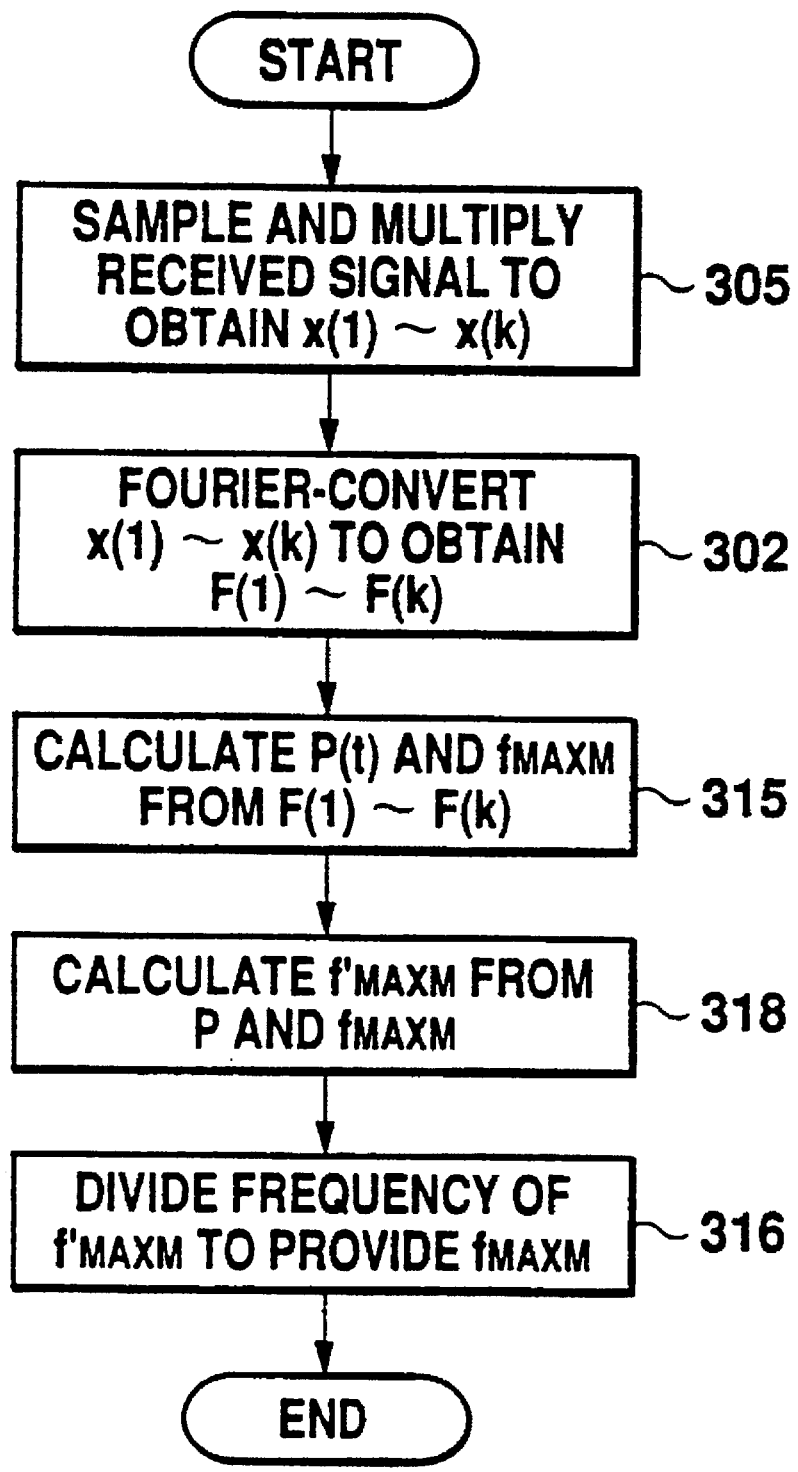
FIG. 18 is a flow diagram showing operations of detectors according to FIGS. 17 and 26.

FIG. 17 is a block diagram showing a maximum value detecting section according to an eighth embodiment of the present invention, and FIG. 18 is a flow diagram showing operation of the detector in FIG. 17.

In FIG. 17, the components up to the time axis/frequency axis converting circuit 1 are the same as those in the second—fourth embodiments, and the numeral 11 designates a frequency interpolating circuit for interpolating the frequency using power spectra at P and at several points before and behind the $f_{MAXM}$ respectively having been output from the maximum value detector 5.

The operation of the eighth embodiment will now be described. As shown in the equation 8, Δfr, is determined only by the number L of processed symbols. Therefore, in such a case of not being able to sufficiently reduce Δfr, the difference between the frequency that should formally become a peak and the detected $f_{MAX}$ can not be reduced. As a result, a certain error will arise in the $f_{MAX}$. To cope with this problem, an interpolation is considered to be carried out on the frequency axis. As an example of the interpolation in this case, there is a method for interpolating the frequency using the power spectrum at P output from the maximum value detector 5 or a neighbor point closely before or behind $f_{MAXM}$. The frequency having been obtained by interpolation and frequency division is designated as $f_{MAX}$ to be output to the frequency correcting circuit. Therefore, the frequency interpolating circuit 11 interpolates for the frequency output from the maximum value detector 2 for performing the frequency correction using the frequency of improved accuracy.

Ninth Embodiment

Figure 19:
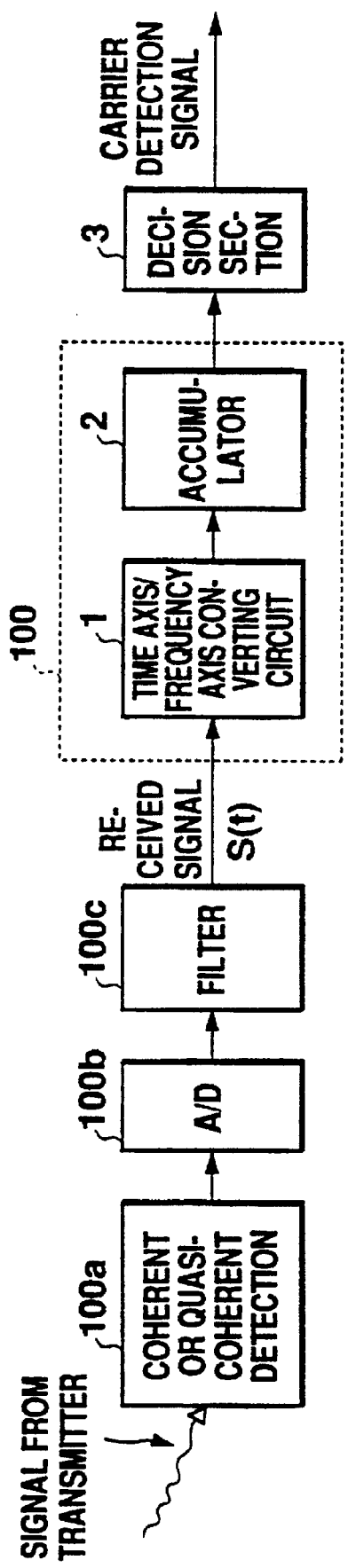
FIG. 19 is a block diagram showing a carrier detector according to a ninth embodiment of the present invention.

FIG. 19 is a block diagram showing a carrier detector according to a ninth embodiment of the present invention, FIG. 2 is a flow diagram showing operation of the detector in FIG. 19, and FIGS. 3 and 4 show total power of the received signals output from the accumulator.

In FIG. 19, the numerals designate respectively: 100a, a section for received signals having been modulated by M-phase PSK to perform coherent or quasi-coherent detection thereon; 100b, an A/D converter for receiving an output from the section 100a and performing A/D conversion thereon; 100c, a filter for eliminating noise from the signals having been converted by the A/D converter; 1, a time axis/frequency axis converting circuit for converting the output signal (received signal) of the filter expressed on the time axis into those expressed on the frequency axis; 2, an accumulator for calculating an accumulated value of the power spectrum of the signals expressed on the frequency axis; 100, a carrier detecting section composed of the time axis/frequency axis converting circuit 1 and the accumulator 2; 3, a decision section for detecting that the burst has come by comparing the accumulated value output from the carrier detecting section to a threshold, detecting a carrier, and outputting a carrier detection signal when a carrier is detected.

The carrier detecting operation by the carrier detecting section is the same as in the first embodiment.

The carrier detector according to the ninth embodiment will now be described with reference to FIG. 19. The time axis/frequency axis converting circuit 1 performs DFT on the received signal, and squares it to render a power spectrum of s(t), so as to provide k signals F(1)–F(k) to be expressed on the frequency axis. The accumulator 2 accumulatively adds the F(1)–F(k) to provide the total power S(t) of s(t). The decision section 3 compares S(t) to a threshold, and detects that the burst has come when the S(t) exceeds the threshold so as to output a carrier detection signal.

Tenth Embodiment

Figure 20:
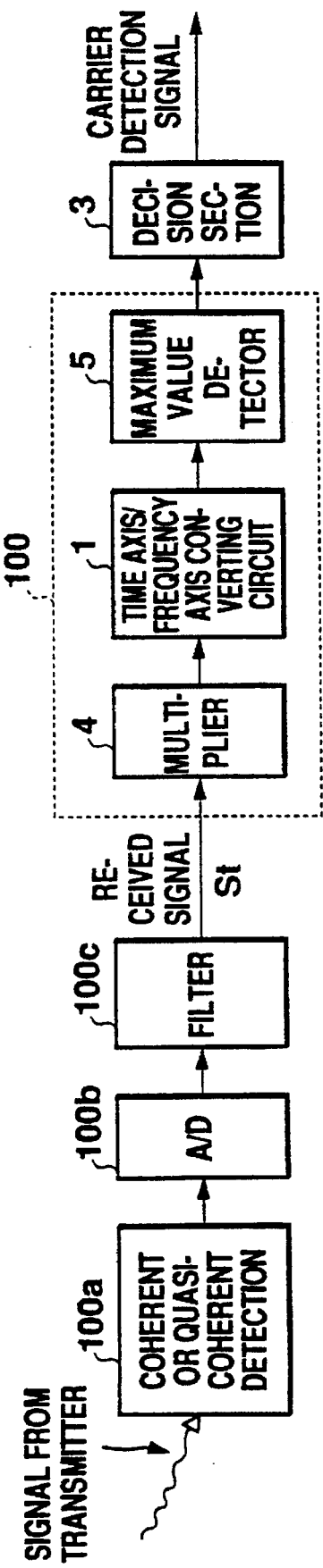
FIG. 20 is a block diagram showing a carrier detector according to the tenth embodiment of the present invention.

FIG. 20 is a block diagram showing a carrier detector according to a tenth embodiment of the present invention, and FIG. 6 is a flow diagram showing operation of the detector in FIG. 20.

In FIG. 20, the numerals designate respectively: 100a, 100b and 100c, the same components as those in the ninth embodiment; 4, a multiplier for multiplying the received signals; 1, a time axis/frequency axis converting circuit similar to that in the ninth embodiment; 5, a maximum value detector for calculating the maximum value of the power spectra of the signals expressed on the frequency axis; 100, a carrier detecting section composed of the multiplier 4, the time axis/frequency axis converting circuit 1, and the maximum value detector 5; and 3, a decision section similar to that in the ninth embodiment.

Therefore, the multiplier 4 multiplies the received signal by M and removes the modulating component, and the time axis/frequency axis converting circuit 1 performs the DFT and the squaring operation in the same manner as in the ninth embodiment to render F(1)–F(k). The maximum value detector 5 outputs P(t) in the same manner as in the ninth embodiment. The decision section 3 compares P(t) to a threshold, and detects that a burst has come when P(t) exceeds the threshold so as to output a carrier detection signal.

In this embodiment, in the same manner as in the second embodiment, when MΔf does not accord with the frequency observing points, the power spectra would be dispersed into two frequency observing points with MΔf therebetween. Therefore, the detected maximum value would be erroneously observed as a value lower than its true maximum value. Thus, the possibility of false detection or miss detection would be raised. To cope with such a problem, the assumed difference between the MΔf and the frequency observing point should be reduced, namely, to lower the frequency resolution by the DFT. If the sampling interval is represented by Δt, the frequency resolution Δfr could be obtained by the equation 8 in the second embodiment. Therefore, the frequency resolution could be reduced by increasing the number of symbols to be processed, so as to improve the carrier detecting accuracy.

Although there has been described a case for calculating the maximum value by the maximum value detector in this embodiment, the same effect could be provided by calculating a value larger than the predetermined value.

Eleventh Embodiment

Figure 21:
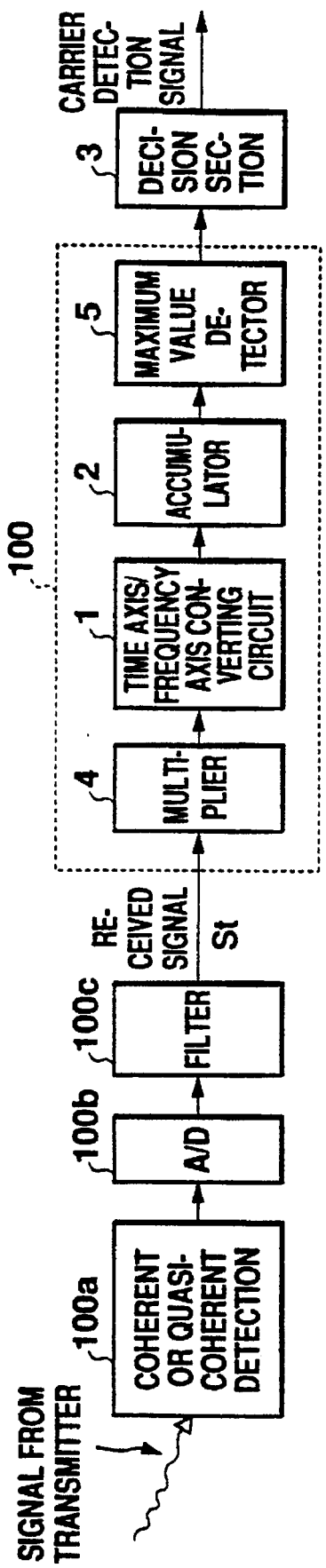
FIG. 21 is a block diagram showing a carrier detector according to the eleventh embodiment of the present invention.

FIG. 21 is a block diagram showing a carrier detector according to an eleventh embodiment of this invention, and FIG. 8 is a flow diagram showing operation of the detector in FIG. 21.

In FIG. 21, the numerals designate respectively: 100a, 100b and 100c, the same components as those in the ninth embodiment; 4 and 1, a multiplier and a time axis/frequency axis converting circuit similar to those in the ninth embodiment; 2, an accumulator for calculating accumulative values of power spectra of the signals expressed on the frequency axis for every several samples; 5, a maximum value detector for detecting a one with the maximum value among a plurality of accumulated values from the accumulator 2; 100, a carrier detecting section composed of the multiplier 4, the time axis/frequency axis converting circuit 1, the accumulator and the maximum value detector 5; 3, a decision section similar to that in the ninth embodiment. The decision section 3 in FIG. 21 compares the maximum value P(t) to the threshold, and detects that a burst has come when the P(t) exceeds the threshold so as to output a carrier detection signal.

Twelfth Embodiment

Figure 22:
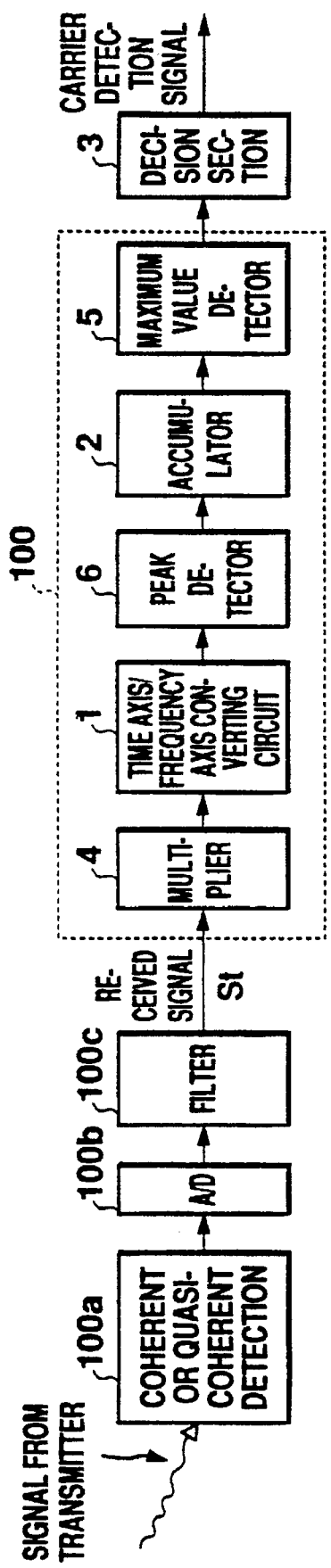
FIG. 22 is a block diagram showing a carrier detector according to the twelfth embodiment of the present invention.

FIG. 22 is a block diagram showing a carrier detector according to a twelfth embodiment of this invention, FIG. 10 is a flow diagram showing operation of the detector in FIG. 22.

In FIG. 22, the numerals designate respectively: 100a, 100b and 100c, the same components as those in the ninth embodiment; 4 and 1, a multiplier and a time axis/frequency axis converting circuit similar to those in the second embodiment; 6, a peak detector for detecting a plurality of peaks in order from the largest one among the power spectra of the signals expressed on the frequency axis; 2, an accumulator for calculating an accumulated value of the power spectra of several samples before and behind the frequency observing points to be peaks output from the peak detector 6; 5, a maximum value detector for detecting that of the maximum value from a plurality of accumulated values output from the accumulator 2; 100, a carrier detecting section composed of the multiplier 4, the time axis/frequency axis converting circuit 1, a peak detector 6, the accumulator 2 and the maximum value detector 5; and 3, a decision section similar to that in the ninth embodiment.

In the eleventh embodiment, an accumulated value is calculated for every observing region to provide X(i). However, if the value of X(i) becomes large at the positions other than MΔf, there would usually be peaks exceeding the mean of F(i) among F(i) (1≦i≦k). Therefore, it would be unnecessary to obtain the accumulated values of the power spectra for every observing region. In this case, it would be sufficient to detect peaks in order from the largest one to an hth one, and calculate X(i) for the h peaks, representing the maximum value of X(i) as P(t).

Accordingly, the multiplier 4 and the time axis/frequency axis converting circuit 1, in the same manner as in the tenth embodiment, would multiply the received signal by M to eliminate the modulating component, apply DFT and squaring operations to the multiplied signal so as to provide F(1)–F(k). The peak detector detects a plurality of peaks in order from the largest one among F(1)–F(k), and the accumulator 2 calculates X(i) represented by the equation 9 for the peaks in the same manner as in the eleventh embodiment. The maximum value detector 5 outputs the maximum value of X(i) at the time t as P(t), in the same manner as in the eleventh embodiment. The decision section 3 compares P(t) to a threshold, and detects that a burst has come when the P(t) exceeds the threshold to output a carrier detection signal.

Thirteenth Embodiment

Figure 23:
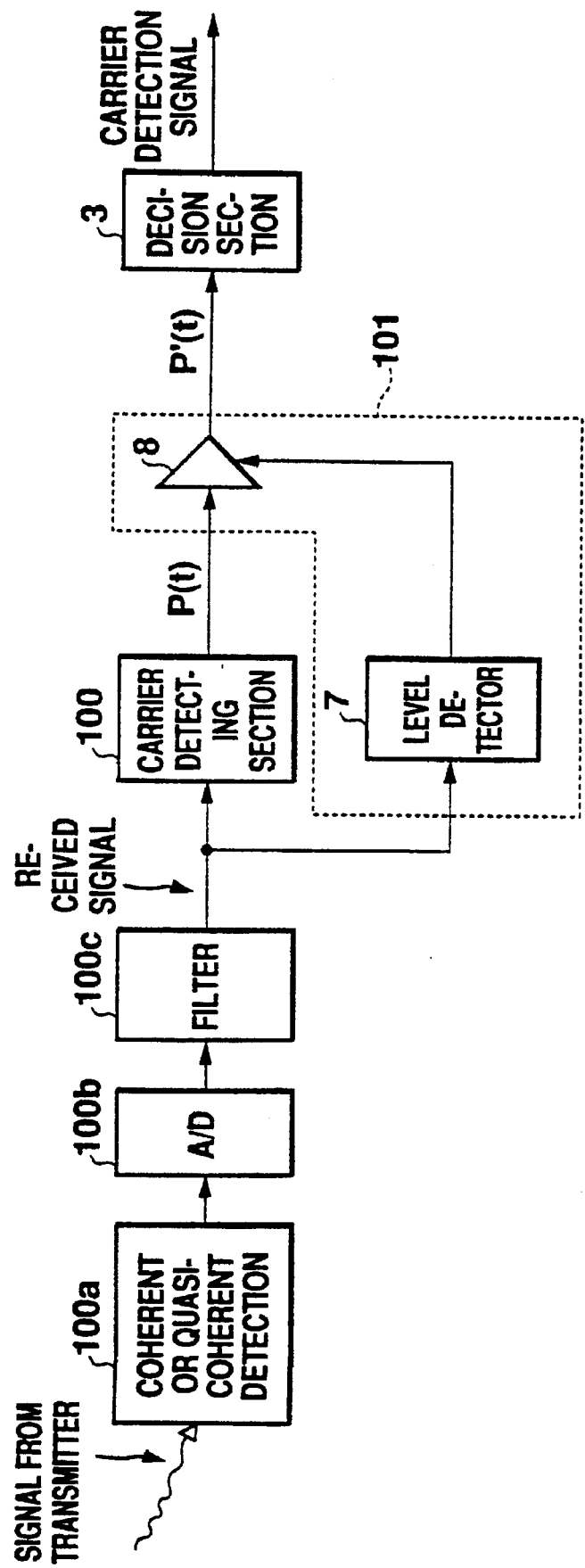
FIG. 23 is a block diagram showing a carrier detector according to the thirteenth embodiment of the present invention.

FIG. 23 is a block diagram showing a carrier detector according to a thirteenth embodiment of the present invention, FIG. 19 is a flow diagram showing operation of the detector in FIG. 23.

In FIG. 23, the numerals designate respectively: 100a, 100b and 100c, the same components as in the ninth embodiment; 3 and 100, a decision section and a carrier detecting section similar to those in the tenth—twelfth embodiments; 7, a level detector for detecting a level of a received signal; 8, an AGC amplifier for adjusting the level of P(t) output from the carrier detecting section 100; 101, an AGC circuit composed of the level detector 7 and the AGC amplifier 8. The AGC circuit would be equivalent to an adjusting circuit.

In the tenth—twelfth embodiments, it has been when P(t) exceeds the threshold that a carrier is detected. In such a method, the detecting operation would be subject to the level of the input signal. Accordingly, AGC is applied on the basis of the detected level of the received signal, which is then output through the carrier detecting section.

The carrier detecting section 100 would operate in the same manner as in the tenth—twelfth embodiments and output P(t). The level detector 7 samples the received signals, calculates the average power Pr of the received signal on the time axis, and further calculates a ratio r of Pr to a power P at C/N=∞.

$$r = Pr/P(C/N=\infty) \tag{10}$$

The time constant for calculating the average power Pr is selected to be such a value as a time suitable for sufficiently averaging the level fluctuation of the signals due to phasing etc. (number of symbols).

The AGC amplifier 8 uses the output P(t) of the carrier detecting section 100 and the output r of the level detector 7 to fulfill the following condition to obtain P'(t):

$$P'(t) = P(t) \times 1/r \tag{11}$$

The decision section 3, in the same manner as in the tenth—twelfth embodiments, compares P'(t) to a threshold to carry out the carrier detection.

Fourteenth Embodiment

Figure 24:
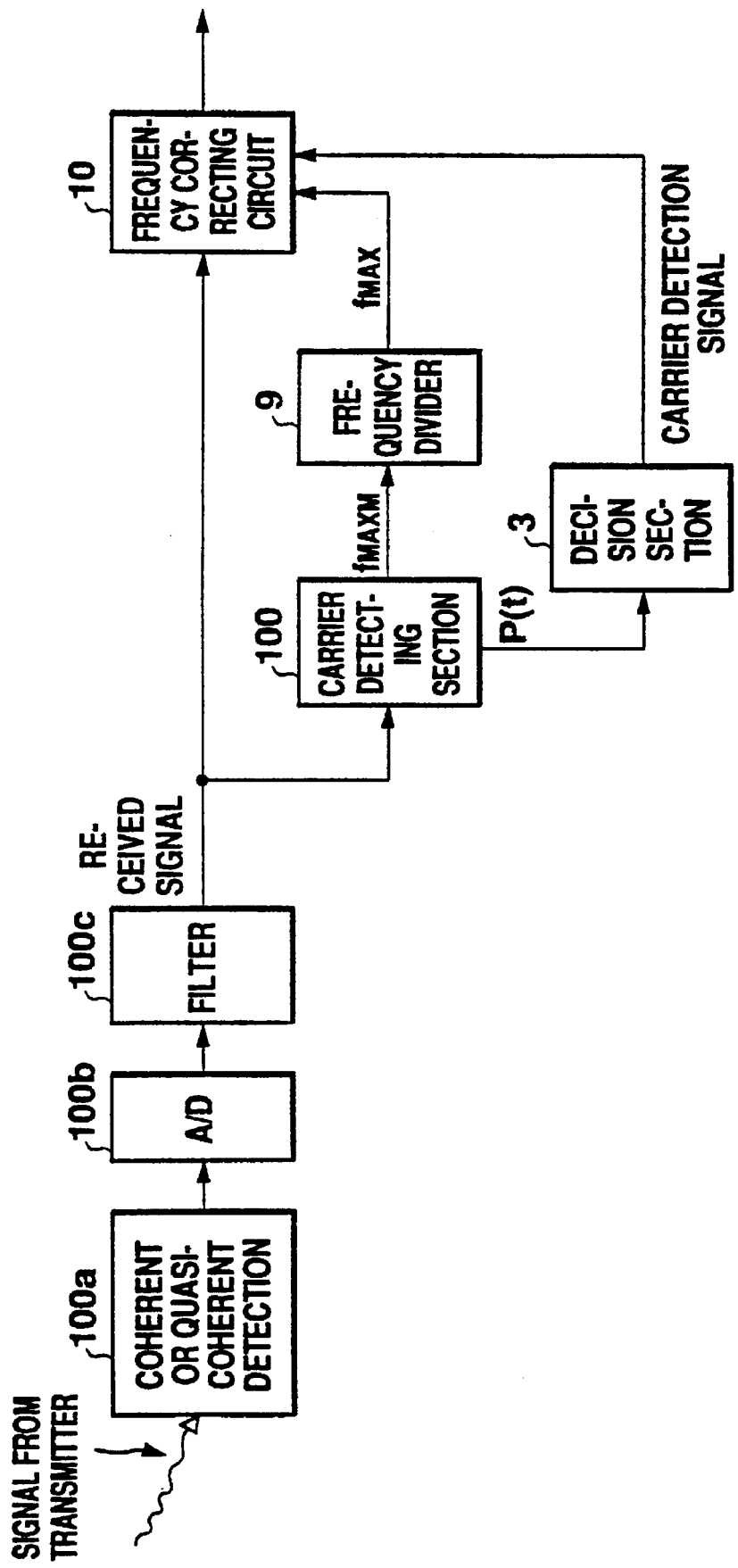
FIG. 24 is a block diagram showing a carrier detector according to the fourteenth embodiment of the present invention.

FIG. 24 is a block diagram showing a carrier detector according to a fourteenth embodiment of this invention, and FIG. 14 is a flow diagram showing operation of the detector in FIG. 24.

In FIG. 24, the numerals designate respectively: 100a, 100b and 100c, the same components as in the ninth embodiment; 3, a decision section operating in the same manner as in that in the tenth—twelfth embodiments; 100, a carrier detecting section operating in the same manner as in the tenth—eleventh embodiments and outputting a frequency to maximize the power spectrum (hereinafter referred to as $f_{MAXM}$); 9, a frequency divider for dividing $f_{MAXM}$ by M to output a frequency offset (hereinafter referred to as $f_{MAX}$); 10, a frequency correcting circuit for correcting the frequency of the received signal using the $f_{MAX}$ output from the frequency divider 9.

The carrier detecting section 100 detects and outputs P(t). In this case, it can simultaneously calculate the frequency offset $f_{MAX}$, so it will now be considered to apply AFC to the received signal using $f_{MAX}$. The carrier detecting section 100 outputs P(t) in the same manner as in the tenth-twelfth embodiments. The frequency corresponding to this P(t) is represented by $f_{MAXM}$ from the results of the eleventh–thirteenth embodiments, and $f_{MAXM}$ equals a frequency offset having been multiplied by M. So, $f_{MAXM}$ is divided by M to render the frequency offset $f_{MAX}$. Since the frequency offset is represented by $f_{MAX}$, shifting the frequency of the received signal by $-f_{MAX}$ in the frequency correcting circuit would become equivalent to the application of AFC.

Fifteenth Embodiment

Figure 25:
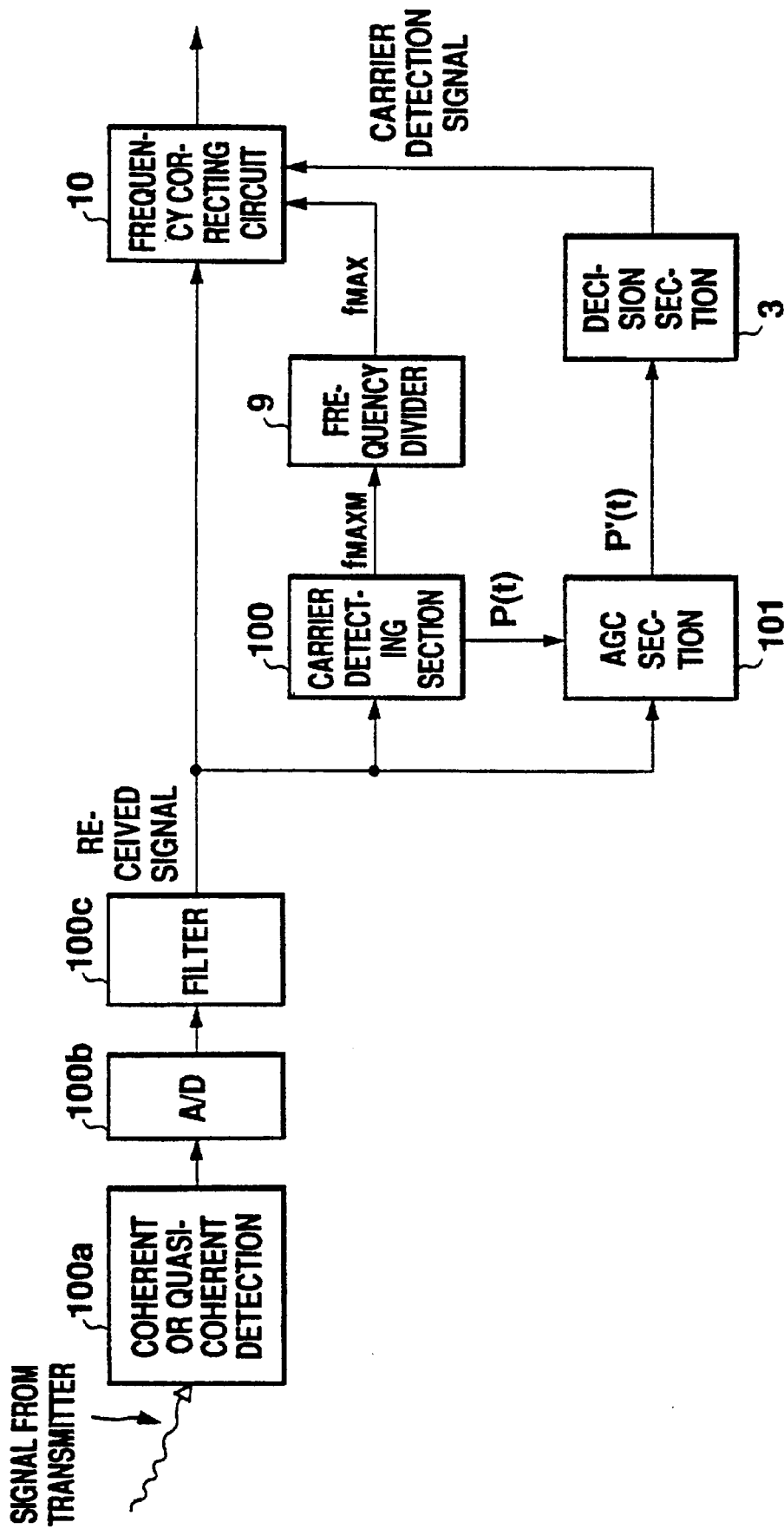
FIG. 25 is a block diagram showing a carrier detector according to the fifteenth embodiment of the present invention.

FIG. 25 is a block diagram showing a carrier detector according to a fifteenth embodiment of the present invention, and FIG. 16 is a flow diagram showing operation of the detector in FIG. 25.

In FIG. 25, the numerals 100a, 100b and 100c designate the same components as in the ninth embodiment. The carrier detecting section 100, the AGC section 101 and the decision section 3 are the same as those in the thirteenth embodiment, while the frequency divider 9 and the frequency correcting circuit 10 are the same as those in the fourteenth embodiment.

In operation of the detector of this embodiment, the carrier detecting section 100 and the AGC section 101 operate and carry out the carrier detection in the same manner as in the thirteenth embodiment, and the frequency divider 9 and the frequency correcting circuit 10 operate, correct the frequency of the received signal, and output a correcting signal in the same manner as in the fourteenth embodiment.

Sixteenth Embodiment

Figure 26:
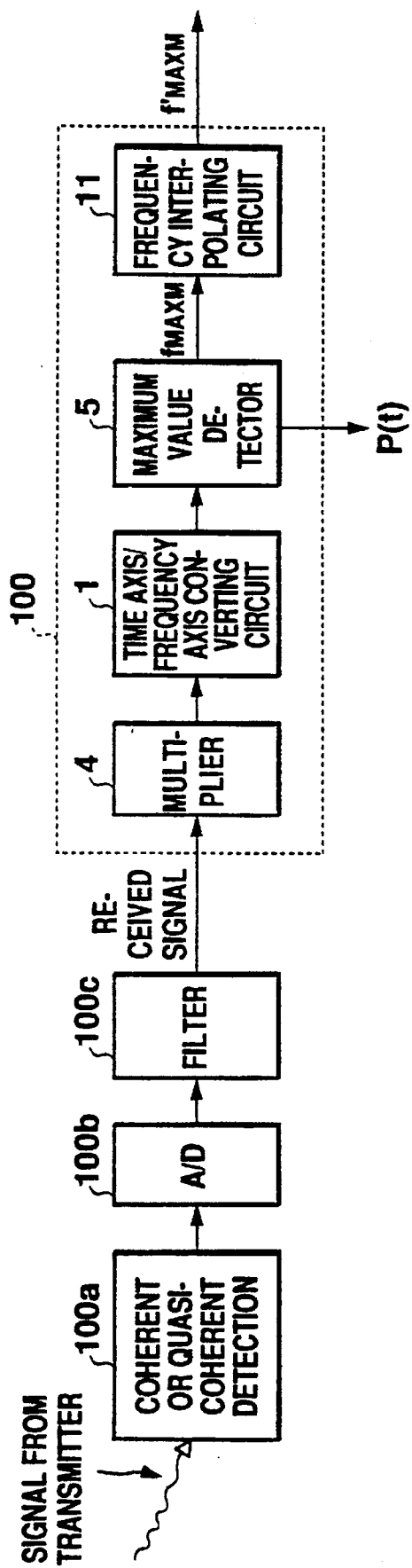
FIG. 26 is a block diagram showing a carrier detector according to the sixteenth embodiment of the present invention.

FIG. 26 is a block diagram showing a maximum value detector according to the sixteenth embodiment of this invention, and FIG. 18 is a flow diagram showing operation of the detector in FIG. 26.

In FIG. 26, the numerals 100a, 100b and 100c designate the same components as in the embodiment 9. The components up to the time axis/frequency axis converting circuit 1 are the same as those in the tenth—twelfth embodiments. The numeral 11 designates a frequency interpolating circuit for interpolating the frequency using the power spectrum at P output from the maximum value detector and at several points before and behind the $f_{MAXM}$.

In operation, as shown in the equation 8, the $\Delta fr$ is determined only by the number L of symbols to be processed. Therefore, in the case of it not being possible to sufficiently reduce $\Delta fr$, it is impossible to reduce the difference between the frequency expected to become the peak and the detected $f_{MAX}$, which therefore would contain error. To cope with such a problem, interpolation on the frequency axis will now be described. The interpolation to be performed in this case could be, for example, carried out by using the power spectrum at P output from the maximum value detector 5 and at one point just before and behind $f_{MAXM}$. Thus obtained frequency by the interpolation and the frequency division is represented by $f_{MAX}$ which is then output to the frequency correcting circuit. As a result, the frequency correcting circuit 10 would make the interpolation for the frequency output from the maximum value detector 5, and correct the frequency using the frequency with improved accuracy.

In the decision section of the ninth embodiment, it has been detected that a carrier is detected when the output of the previous stage exceeds the threshold. Alternatively, it is also possible to detect as such only when the output exceeds the threshold for a predetermined period in view of the influence due to the noise or the level fluctuation.

In the decision section of the tenth—sixteenth embodiment, it has been detected that the carrier is detected when the output of the previous stage exceeds the threshold. Alternatively, it is also possible to improve the carrier detecting accuracy by detecting that detection has been achieved when the same or near frequency exceeds the threshold for a predetermined period in view of the noise or the level fluctuation, or even when it does not exceed the threshold, by detecting that the detection has been achieved only when the same or near frequency is stably assumed for a certain period.

In this embodiment, the burst has been in a PN pattern, but if there is a CR pattern in the burst, this part can be used for the carrier detection. In this case, since the CR pattern is non-modulating, a multiplying operation is unnecessary in the carrier detecting section in the tenth—sixteenth embodiments, so as not to require any multiplier. By the same reason, the multiplier and the frequency divider are unnecessary so the circuit structure becomes simplified.

Also in this embodiment, the carrier detector has been operated in continuous mode without burst synchronization. However, if the burst is synchronized, the carrier detecting operation should be processed only once for one burst with synchronicity so as to reduce the calculating amount. In the tenth—twelfth embodiments, when AFC is applied during communication with the burst being synchronized, the P(t) need not be compared to the threshold and AFC can be applied using a frequency corresponding to P(t) so as to reduce the calculating amount.

Software is made on the basis of the flow charts shown in the ninth—sixteenth embodiments. The carrier detector is controlled by the operation of a CPU based on the software.

Seventeenth Embodiment

Figure 27:
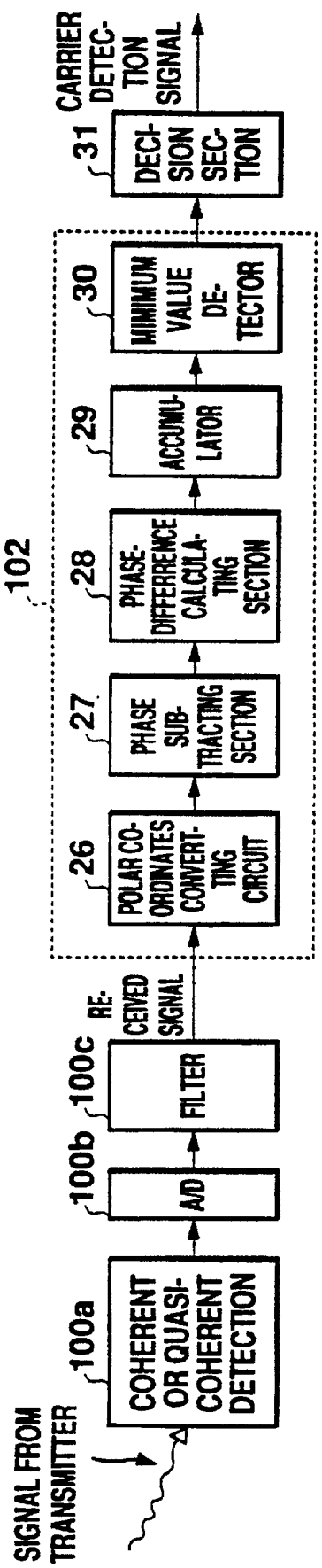
FIG. 27 is a block diagram showing a carrier detector according to the seventeenth embodiment of the present invention.
Figure 28:
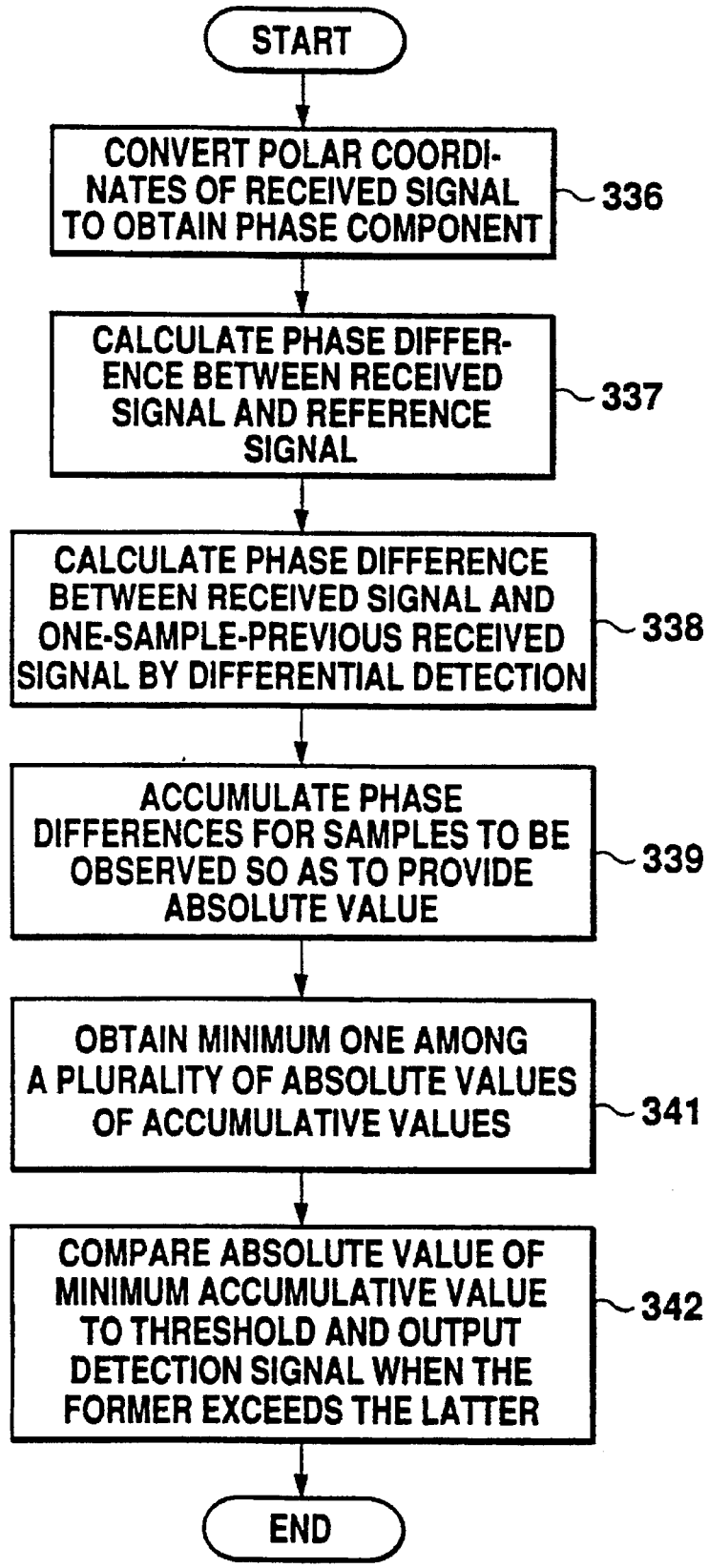
FIG. 28 is a flow diagram showing operation of the detector shown in FIG. 27.

FIG. 27 is a block diagram showing a carrier detector according to a seventeenth embodiment of this invention, FIG. 28 is a flow diagram showing operation of the detector in FIG. 27.

In FIG. 27, the numerals 100a, 100b and 100c designate the same components as those in the ninth embodiment. The numerals designate respectively: 26, a polar coordinates converting circuit for converting polar coordinates of the received signal; 27, a phase subtracting section for subtracting a phase of a previously stored reference signal from a phase of the received signal for providing the correlation of the received signal to the reference signal; 28, a phase difference calculating section for calculating a difference between a phase output from the phase subtracting section 27 and a phase of one-sample previous output; 29, an accumulator for accumulating the phase difference output from the phase difference calculating section 28 to provide the absolute value of the accumulated value; 30, a minimum value detector for selecting and outputting the minimum absolute value among a plurality of absolute values of the accumulated values output from the accumulator 29; 102, a correlator composed of the polar coordinates converting circuit 26, the phase subtracting circuit 27, the phase difference calculating circuit 28, the accumulator 29 and the minimum value detector 30; and 31, a decision section for detecting the coming of burst by comparing the absolute value of the accumulated value output from the correlator 102 to the threshold, detecting a carrier, and outputting a carrier detection signal when a carrier is detected.

With the received signal s(t) being sampled at a sampling period T, kth received signal being represented by s (KT), its phase component θ(kT) and amplitude component R(kT), θ(kT) can be expressed as follows:

$$\theta(kT) = \Delta\theta + \Delta\theta kT + \theta_{MOD}(kT) + \theta_{NS}(kT) \quad (12)$$

T: sampling period
Δθ: initial phase difference
Δω: offset angular frequency
$\theta_{NS}(kT)$: phase component of noise at time kT
$\theta_{MOD}(kT)$: modulating component of phase at time KT in case of CR pattern, $\theta_{MOD}(kT)=0$ With the phase component of the reference signal being $\theta_{REF}(kT)$, and the amplitude component $R_{REF}(kT)$, $\theta_{REF}(kT)$ can be expressed as follows:

$$\theta_{REF}(kT) = \Delta\theta_{REF} + \Delta\omega_{REF} kt \quad (13)$$

$\Delta\theta_{REF}$: initial phase difference of reference signal $\Delta\omega_{REF}$: angular frequency of reference signal The phase difference Φ(kT) between the received signal and the reference signal could be provided by the following equation:

$$\begin{aligned}
\Phi(kT) &= \theta(kT) - \theta_{REF}(kT) \quad (14) \\
&= \Delta\theta + \Delta\omega kT + \\
&\quad \theta_{MOD}(kT) + \theta_{NS}(kT) - \Delta\theta_{REF} - \Delta\omega_{REF} kT \\
&= \{\Delta\theta - \Delta\theta_{REF}\} + \{\Delta\omega - \Delta\omega_{REF}\} kT + \\
&\quad \theta_{MOD}(kT) + \theta_{NS}(kT)
\end{aligned}$$

The phase difference ΔΦ(kT) from one-previous sample would be expressed as follows:

$$\begin{aligned}
\Delta\Phi(kT) &= \Phi(kT) - \Phi(kT-T) \quad (15) \\
&= \{\Delta\theta - \Delta\theta_{REF}\} + \{\Delta\omega - \Delta\omega_{REF}\} kT + \\
&\quad \theta_{MOD}(kT) + \theta_{NS}(kT) - \\
&\quad \{\Delta\theta - \Delta\theta_{REF}\} - \{\Delta\omega - \Delta\omega_{REF}\}(kT-T) - \\
&\quad \theta_{MOD}(kT-T) - \theta_{NS}(kT-T) \\
&= \{\Delta\omega - \Delta\omega_{REF}\} T + \\
&\quad \{\theta_{MOD}(kT) - \theta_{MOD}(kT-T)\} + \\
&\quad \{\theta_{NS}(kT) - \theta_{NS}(kT-T)\}
\end{aligned}$$

This can be represented by a sum of the phase difference corresponding to the frequency difference between the received signal and the reference signal, the phase component due to the modulation, and the phase component due to the noise. The sum S of the phase difference for L samples can be obtained by:

$$\begin{aligned}
S = \sum_{K=1}^{L} \Delta\Phi(kT) &= \{\Delta\omega - \Delta\omega_{REF}\} LT + \quad (16)\\
&\quad \{\theta_{MOD}(LT) - \theta_{MOD}(0)\} + \\
&\quad \{\theta_{NS}(LT) - \theta_{NS}(0)\}
\end{aligned}$$

In the case of the received signal being a CR pattern, the second item of the equation 16 would become zero, as a result:

$$\begin{aligned}
S_{CR} = \sum_{K=1}^{L} \Delta\Phi(kT) &= \{\Delta\omega - \Delta\omega_{REF}\} LT + \quad (17)\\
&\quad \{\theta_{NS}(LT) - \theta_{NS}(0)\}
\end{aligned}$$

The |S| and $|S_{CR}|$ will now be considered. In the equations 16 and 17, T and L are fixed values. Accordingly, when the offset frequency of the received signal is equal to the frequency of the reference signal ($\{\Delta\omega-\Delta\omega_{REF}\}=0$), the value of |S| and $|S_{CR}|$ will become minimum, and both equations will be converted as follows:

$$|S| = \left| \sum_{K=1}^{L} \Delta\Phi(kT) \right| = |\{\theta_{MOD}(LT) - \theta_{MOD}(0)\} + \quad (18)$$
$$\{\theta_{NS}(LT) - \theta_{NS}(0)\}|$$

$$|S_{CR}| = \left| \sum_{K=1}^{L} \Delta\Phi(kT) \right| = |\{\theta_{NS}(LT) - \theta_{NS}(0)\}| \quad (19)$$

Accordingly, the aforementioned processes are carried out for a plurality of reference signals, a case in which the absolute value of the accumulated value becomes minimum is selected, and that value is compared to a threshold capable of separating $|S_{CR}|$ therefrom. If it is smaller than the threshold, it is detected that the CR pattern has come.

The carrier detector according to the seventeenth embodiment will now be described with reference to FIGS. 27 and

19

28. The polar coordinates converting circuit 26 calculates the phase component of the received signal, and the phase subtracting circuit 27 subtracts the phase of the reference signal from the phase of the received signal. The phase difference calculating section 28 calculates the difference between the phase output from the phase subtracting section 27 and that of one-sample previous, and the accumulator 29 accumulates the phase differences for the samples to be observed so as to render the absolute value thereof. The minimum value detector 30 selects and outputs the minimum of the absolute values of a plurality of accumulated values output from the accumulator 29. The decision section 31 compares the minimum of the absolute values of the accumulated value output from the minimum value detector 30, and detects that burst has come when the minimum is smaller than the threshold so as to output a carrier detection signal.

Eighteenth Embodiment

Figure 29:
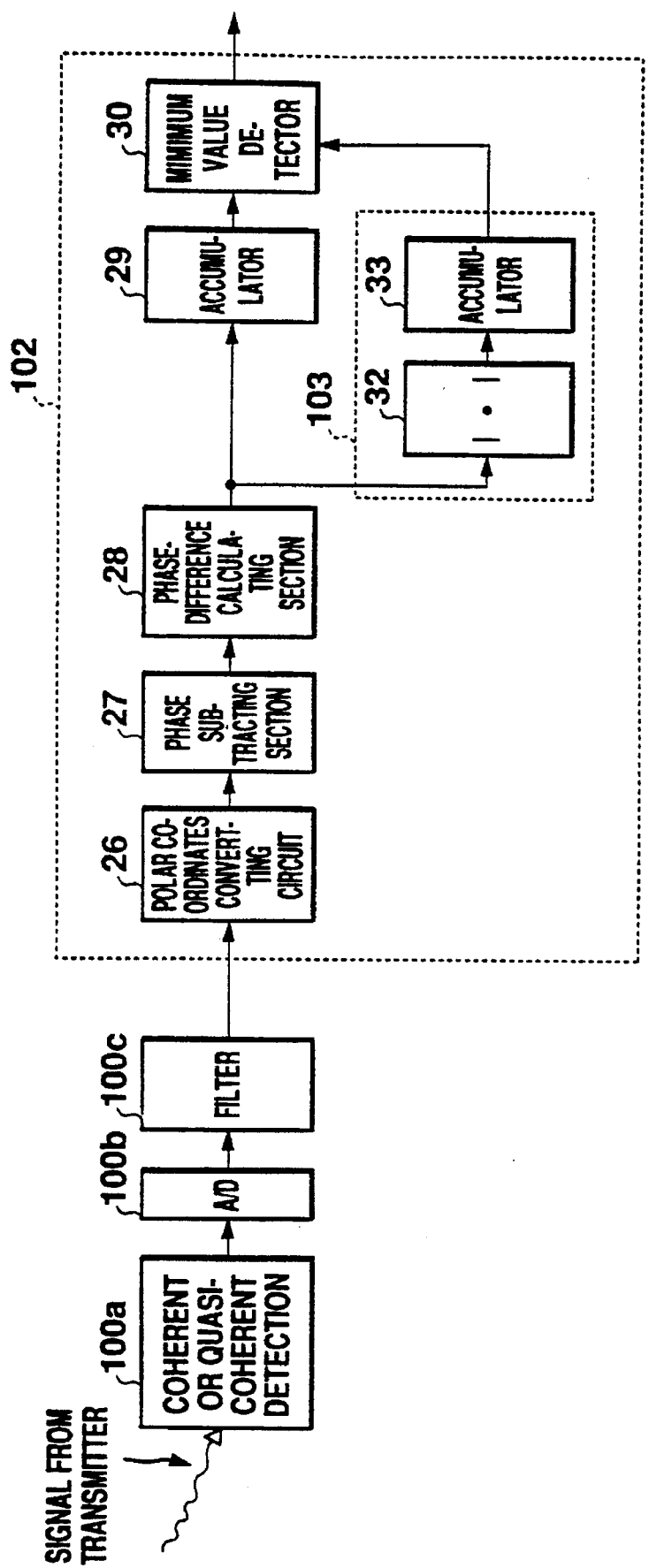
FIG. 29 is a block diagram showing a correlator according to the eighteenth embodiment of the present invention.
Figure 30:
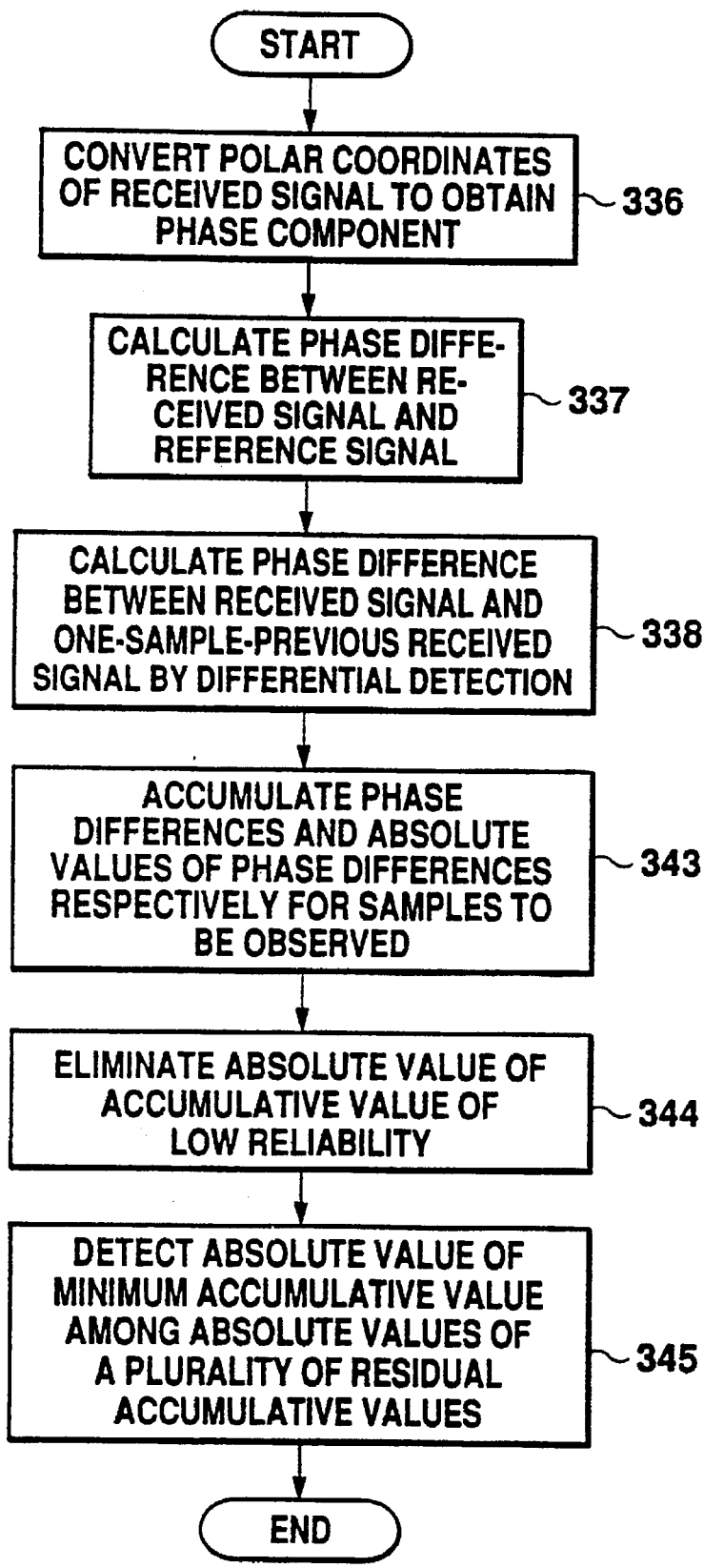
FIG. 30 is a flow diagram showing operation of the detector in FIG. 29.

FIG. 29 is a block diagram showing a correlator according to an eighteenth embodiment of the present invention, FIG. 30 is a flow diagram showing operation of the section in FIG. 29.

In FIG. 29, the numerals designate respectively: 100a, 100b and 100c, the same components as those in the ninth embodiment; 26, a polar coordinates converting circuit; 27, a phase subtracting circuit; 28, a phase difference calculating circuit; 29, an accumulator; 30, a minimum value detector; 32, an absolute value calculating circuit for calculating an absolute value of phase difference output from the phase difference calculating circuit; 33, an accumulator for accumulating the outputs from the absolute value calculating circuit 32; 103, a reliability calculating section composed of the absolute value calculating circuit 32 and the accumulator 33; 102, a correlator composed of the polar coordinates converting circuit 26, the phase subtracting section 27, the phase difference calculating section 28, the accumulator 29, the minimum value detector 30 and the reliability calculating section 103.

In the seventeenth embodiment, $\Delta\Phi(kT)$ has been obtained by the equation 15. However, $\Delta\Phi(kT)$ could not be obtained other than in the residual of the scope of $[-\pi, \pi]$. So, in the case of a CR pattern in the equation 15, for example, if $$\{\Delta\omega - \Delta\omega_{REF}\}T = \pi or - \pi$$

then $\Delta\Phi(kT)$ would become a value near $\pm\pi$ due to the noise. Therefore, when these are accumulated to provide the absolute value thereof, there would be a case in which $|S_{CR}|$ would become almost 0. To cope with this problem, it will now be considered to obtain the reliability of the accumulated value and to select an accumulated value of low reliability to be eliminated.

Firstly, the absolute value of $\Delta\Phi(kT)$ is accumulated, and this accumulated value is represented by M.

$$M = \sum_{K=1}^{L} |\Delta\Phi(kT)| \quad (20)$$

Likewise the aforementioned example, even if $\{\Delta\omega - \Delta\omega_{REF}\}T = \pi$ or $-\pi$ and the absolute value of the accumulated value of that case becomes small, M in this case would be a large value because of being an accumulation of a value near $\pi$ so as to be distinguished from that in the case of $\{\Delta\omega - \Delta\omega_{REF}\}T = 0$.

The correlator according to the eighteenth embodiment of this invention will now be described with reference to FIG. 29. The polar coordinates converting circuit 26, the phase

20 subtracting circuit 27, the phase difference calculating section 28, and the accumulator 29 operate in the same manner as in the seventeenth embodiment. The absolute value calculating circuit 32 calculates the absolute value of the phase difference output from the phase difference calculating section 28, and the accumulator 33 accumulates the absolute value for the same sample as those for the accumulator 29. The minimum value detector 30 detects the minimum one of the absolute values of a plurality of accumulated values output from the accumulator 29, but does not perform the detection for the absolute values of the accumulated values of the reference signals with large M output from the accumulator 33 due to its low reliability. Therefore, it becomes possible to detect the one of minimum absolute value of the accumulated values from among those of high reliability.

Nineteenth Embodiment

Figure 31:
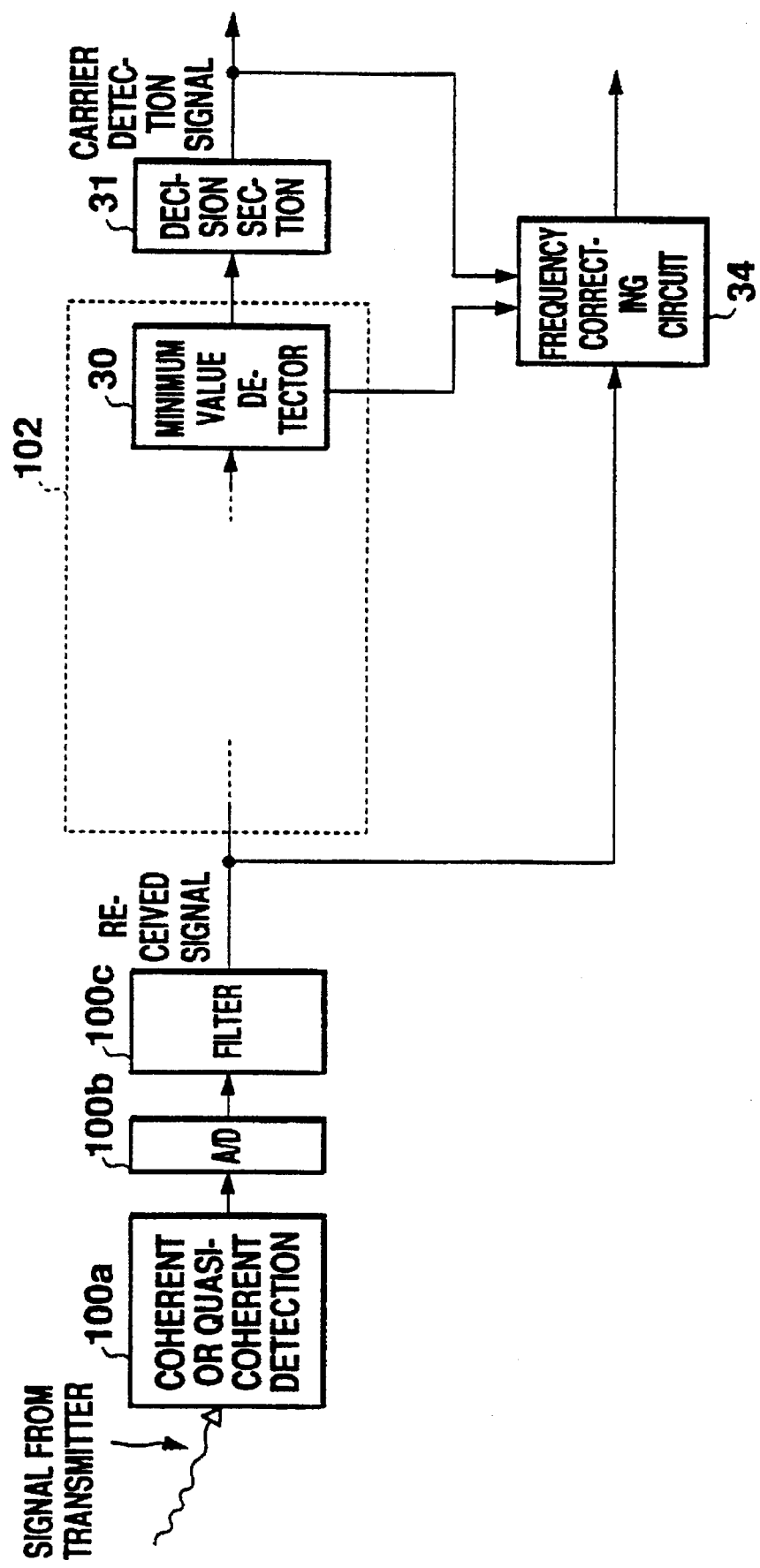
FIG. 31 is a block diagram showing operation of the carrier detector according to the nineteenth embodiment of the present invention.
Figure 32:
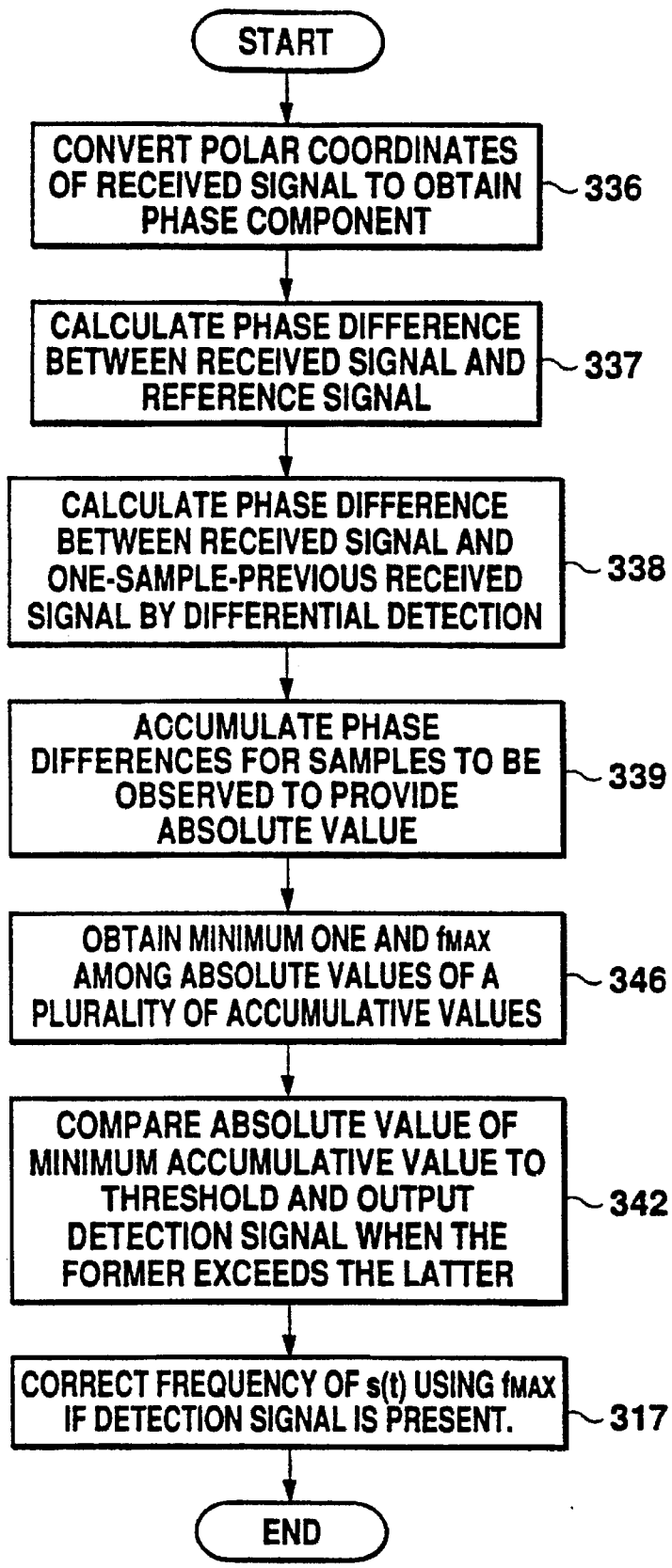
FIG. 32 is a flow diagram showing operation of the detector in FIG. 31.

FIG. 31 is a block diagram showing a carrier detector according to a nineteenth embodiment of this invention, FIG. 32 is a flow diagram showing operation of FIG. 31.

In FIG. 31, the numerals 100a, 100b and 100c designate the same components as those in the ninth embodiment. The correlator 102 is the same as that in the seventeenth and eighteenth embodiments. The numeral 34 designates a frequency correcting circuit for correcting a frequency of the received signal using the frequency information output from the minimum value detector 30.

The minimum value detector 30 outputs the minimum absolute value of the accumulated values. However, since the reference signal minimizing the absolute value of the accumulated value is the offset frequency of the received signal, it is possible to obtain the frequency offset $f_{MAX}$ at the same time, in this case. Therefore, when a carrier detection signal is output, AFC can be applied to the received signal in the same manner as in the fourteenth embodiment.

Twentieth Embodiment

Figure 33:
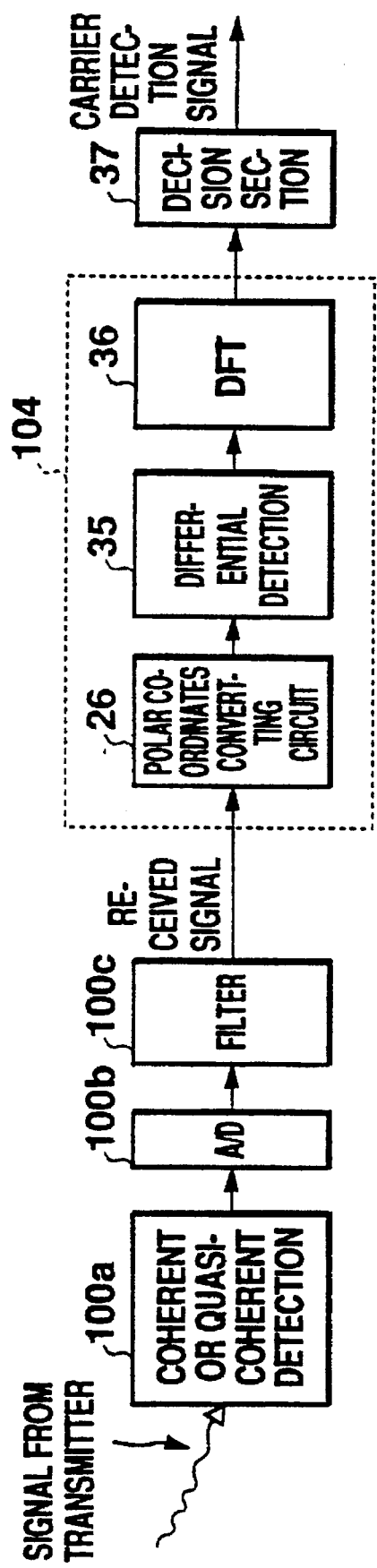
FIG. 33 is a block diagram showing a carrier detector according to the twentieth embodiment of the present invention.
Figure 34:
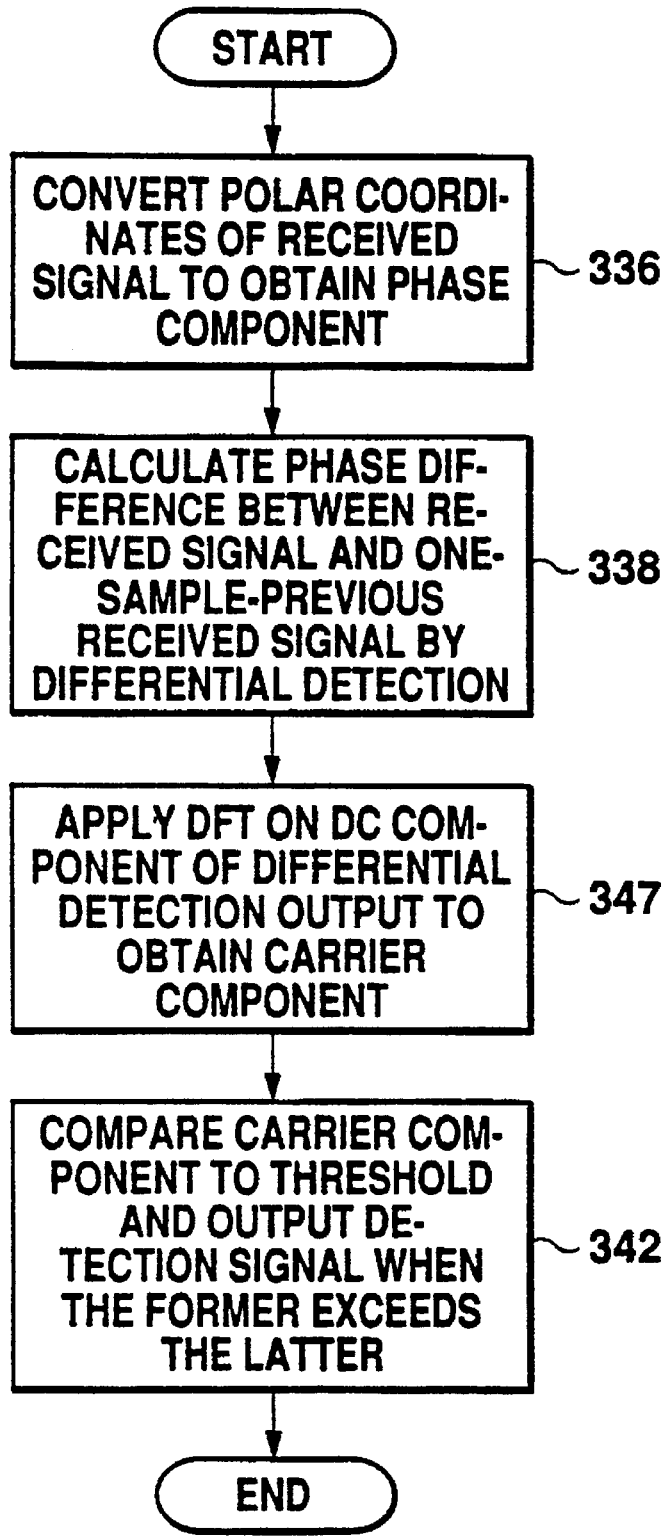
FIG. 34 is a flow diagram showing operation of the detector in FIG. 33.

FIG. 33 is a block diagram showing a carrier detector according to twentieth embodiment of this invention, FIG. 34 is a flow diagram showing operation of FIG. 33.

In FIG. 33, the numerals designate respectively: 100a, 100b and 100c, the same components as in the ninth embodiment; 26, the same polar coordinates converting circuit as in the seventeenth embodiment; 35, a differential detecting section for obtaining the difference between the phase output from the polar coordinates converting circuit 26 and the phase of one-sample previous; 36, a DFT for calculating a carrier component of the received signal by applying DFT using the phase output from the differential detecting section 35; 104, a carrier component calculating section composed of the polar coordinates converting circuit 26, the differential detecting section 35 and the DFT 36; 37, a decision section for detecting the coming of burst by comparing the value output from the carrier component calculating section 104 to the threshold, detecting a carrier, and outputting a carrier detection signal when the carrier is detected.

Differential detection is made on the output from the polar coordinates converting circuit 26, and the result $\psi(kT)$ is expressed as follows:

$$\psi(kT) = \theta(kT) - \theta(kT-T) \quad (21)$$
$$= \Delta\theta + \Delta\omega kT + \theta_{MOD}(kT) + \theta_{NS}(kT) -$$
$$\Delta\theta - \Delta\omega(k-1)T - \theta_{MOD}(kT-T) -$$
$$\theta_{NS}(kT-T)$$
$$= \Delta\omega T + \{\theta_{MOD}(kT) - \theta_{MOD}(kT-T)\} +$$
$$\{\theta_{NS}(kT) - \theta_{NS}(kT-T)\}$$

In the case of CR pattern, $$\psi_{CR}(kT) = \theta(kT) - \theta(kT-T) \quad (22)$$
$$= \Delta\theta + \Delta\omega kT + \theta_{NS}(kT) -$$
$$\Delta\theta - \Delta\omega(k-1)T - \theta_{NS}(kT-T)$$
$$= \Delta\omega T + \{\theta_{NS}(kT) - \theta_{NS}(kT-T)\}$$

From the equation 22, the offset frequency would have a fixed phase by performing the differential detection, so as to appear in the DC component in the power spectrum of the differential detection result. However, when there is a phase fluctuation due to the modulating component or noise, no fixed phase will appear. so that the DC component becomes reduced in the power spectrum. Therefore, the DC component is extracted to be compared to a threshold capable of separating a CR pattern, and it is detected that a CR pattern has come when it is larger than the threshold.

The carrier detector according to the twentieth embodiment will now be described with reference to FIG. 33. The polar coordinates converting circuit 26 would calculate the phase component of the received signal, and the differential detecting section 35 calculates the difference between the phase output from the polar coordinates converting circuit 26 and the phase of that one sample-previous. The DFT 36 carries out DFT using this phase to obtain the power spectrum in DC. The decision section 37 compares the power spectrum to a threshold, and detects that burst has come when it is larger than the threshold so as to output a carrier detection signal.

Twenty-first Embodiment

Figure 35:
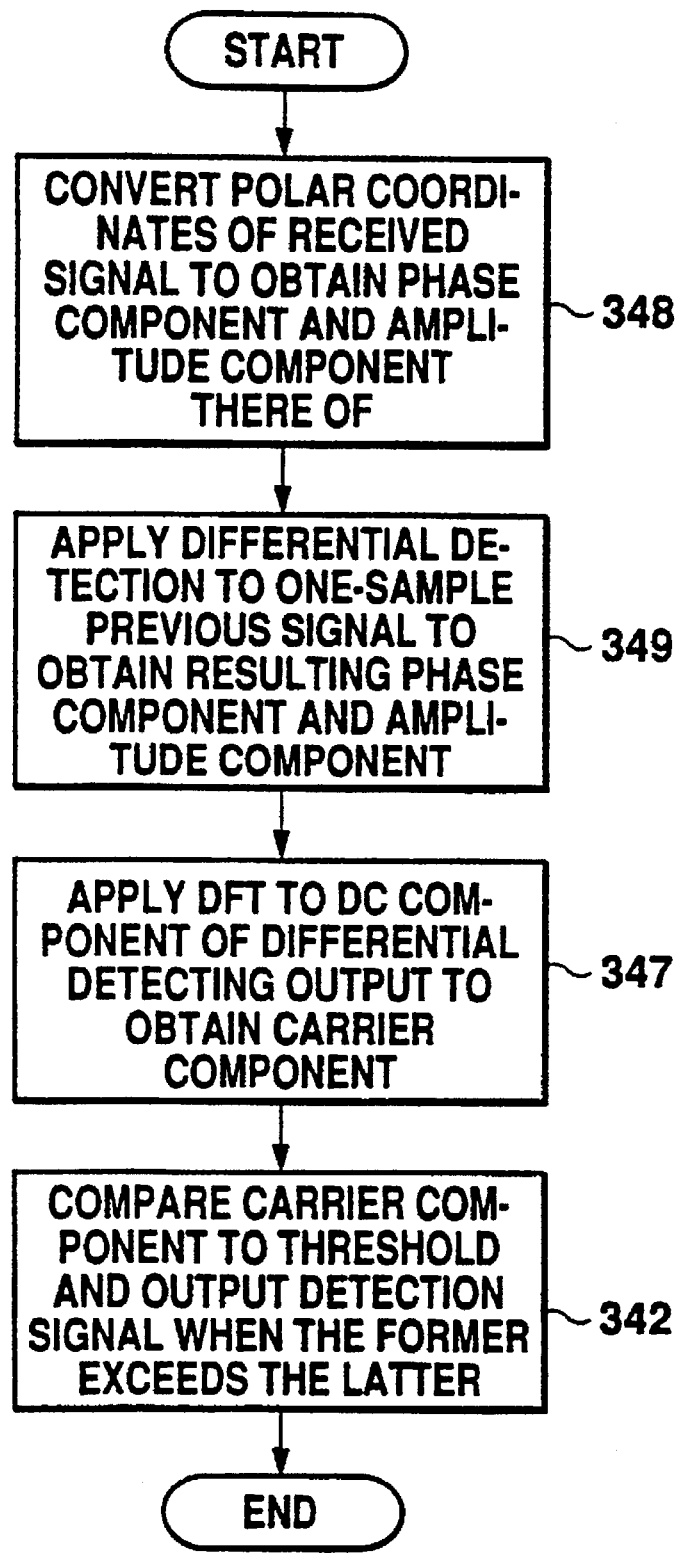
FIG. 35 is a flow diagram showing operation of the carrier detector according to a 21st embodiment of the present invention.

FIG. 33 is a block diagram showing a carrier detector according to this embodiment, and FIG. 35 is a flow diagram showing operation of the detector in FIG. 33.

FIG. 33 is the same as that in the twentieth embodiment.

The differential detecting section performs the differential detection in the same manner as in the twentieth embodiment, but in this embodiment the differential detection is carried out in view of the amplitude component of the signal. As a result, the equation 21 will be expressed as follows:

$$\psi\theta(kT)=[\Delta\omega T+\{\theta_{MOD}(kT)-\theta_{MOD}(kT-T)\}$$
$$+\{\theta_{NS}(kT)-\theta_{NS}(KT-T)\}]$$

$$\psi R(kT)=R(kT)R(kT-T) \quad (23)$$

The same processes as in the twentieth embodiment are performed using the phase obtained by the equation 23 to provide a carrier component in DC. ψR(kT) is then multiplied by that value so that a carrier is detected by comparison of that value with a threshold.

The carrier detector according to the twentieth embodiment will now be described with reference to FIG. 33. The polar coordinates converting circuit 26 calculates the phase component and the amplitude component of the received signal by performing the polar coordinates conversion on the received signal. The differential detecting section 35 performs differential detection using the phase and amplitude output from the polar coordinates converting circuit 26, the DFT 36 performs DFT using the differential detected result to render the power spectrum in DC. The decision section 37 operates in the same manner as in the twentieth embodiment so as to output a carrier detection signal.

Twenty-second Embodiment

Figure 36:
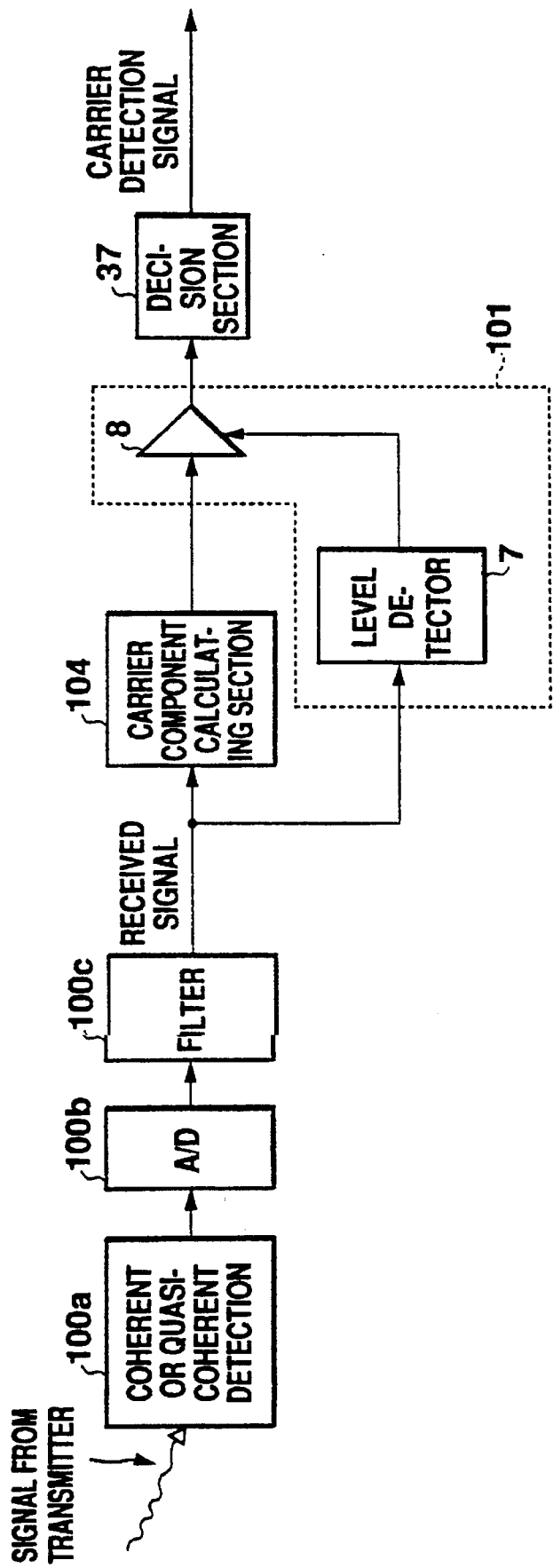
FIG. 36 is a block diagram showing a carrier detector according to a 22nd embodiment of the present invention.
Figure 37:
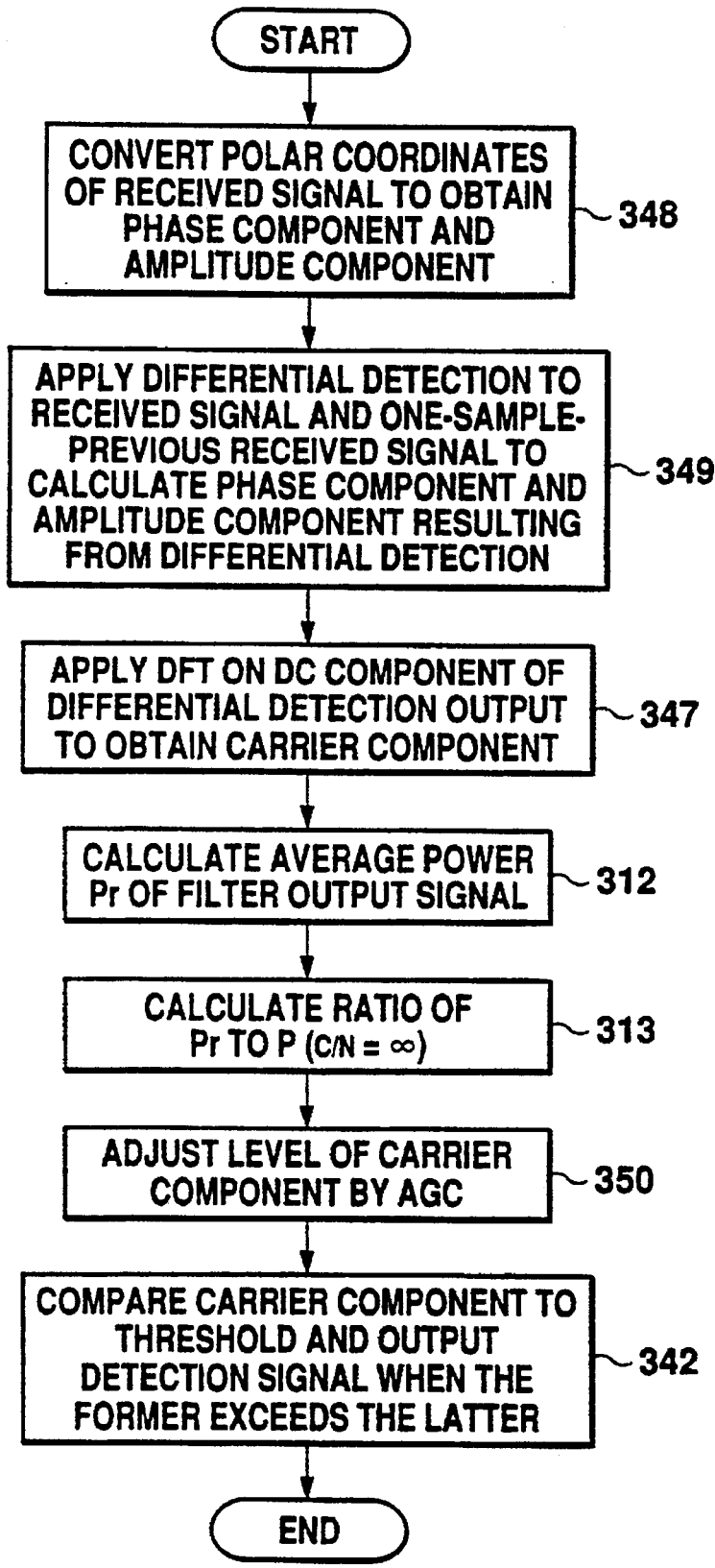
FIG. 37 is a flow diagram showing operation of the detector in FIG. 36.

FIG. 36 is a block diagram of a carrier detector according to this embodiment of the present invention, and FIG. 37 is a flow diagram showing operation of the detector in FIG. 36.

In FIG. 36, the numerals 100a, 100b and 100c designate the same components as those in the ninth embodiment. The carrier component calculating section 104 and the decision section 37 are the same as those in the twenty-first embodiment, and the level detector 7, the AGC amplifier 8, and the AGC section 101 are the same as those in the thirteenth embodiment.

In the decision section of the twenty-first embodiment, the carrier is detected when the power spectrum exceeds the threshold, such that the detecting operation is subject to the influence of the input signal level. Accordingly, it will now be considered to compensate for the level of the power spectrum by measuring the level of the received signal and applying AGC thereto. The operations of the level detection and the AGC application are the same as those in the thirteenth embodiment.

The carrier detector according to the twenty-second embodiment will now be described with reference to FIG. 36. The carrier component calculating section 104 would output a power spectrum in the same manner as in the twenty-first embodiment. The level detector 7 calculates Pr of the received signal, determines the amplitude rate of the AGC amplifier 8, and the AGC amplifier 8 applies AGC to the power spectrum output from the carrier component calculating section 104. The decision section 37 operates in the same manner as in the twentieth embodiment for the power spectrum having been subject to the AGC so as to output a carrier detection signal.

Twenty-third Embodiment

Figure 38:
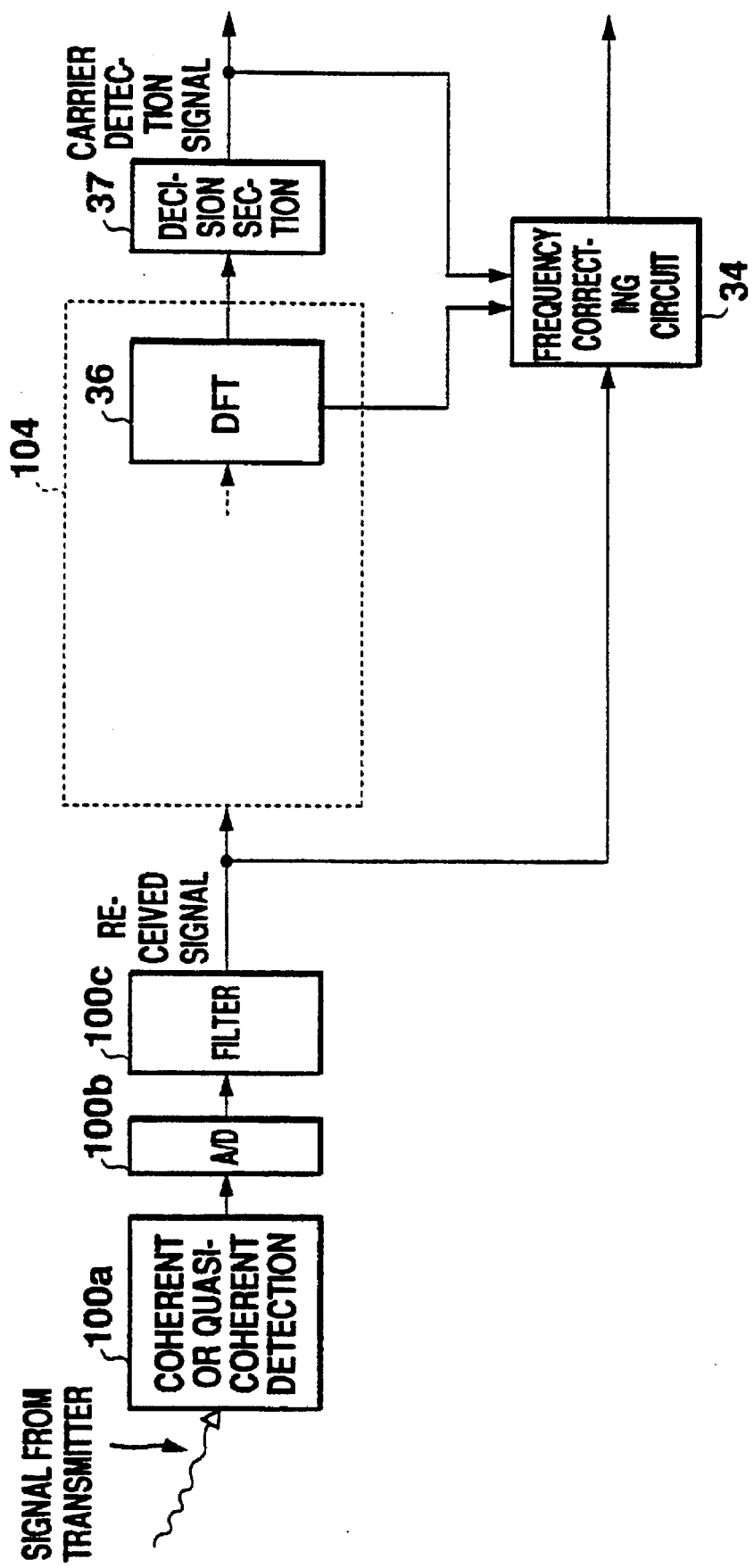
FIG. 38 is a block diagram of a carrier detector according to a 23rd embodiment of the present invention.
Figure 39:
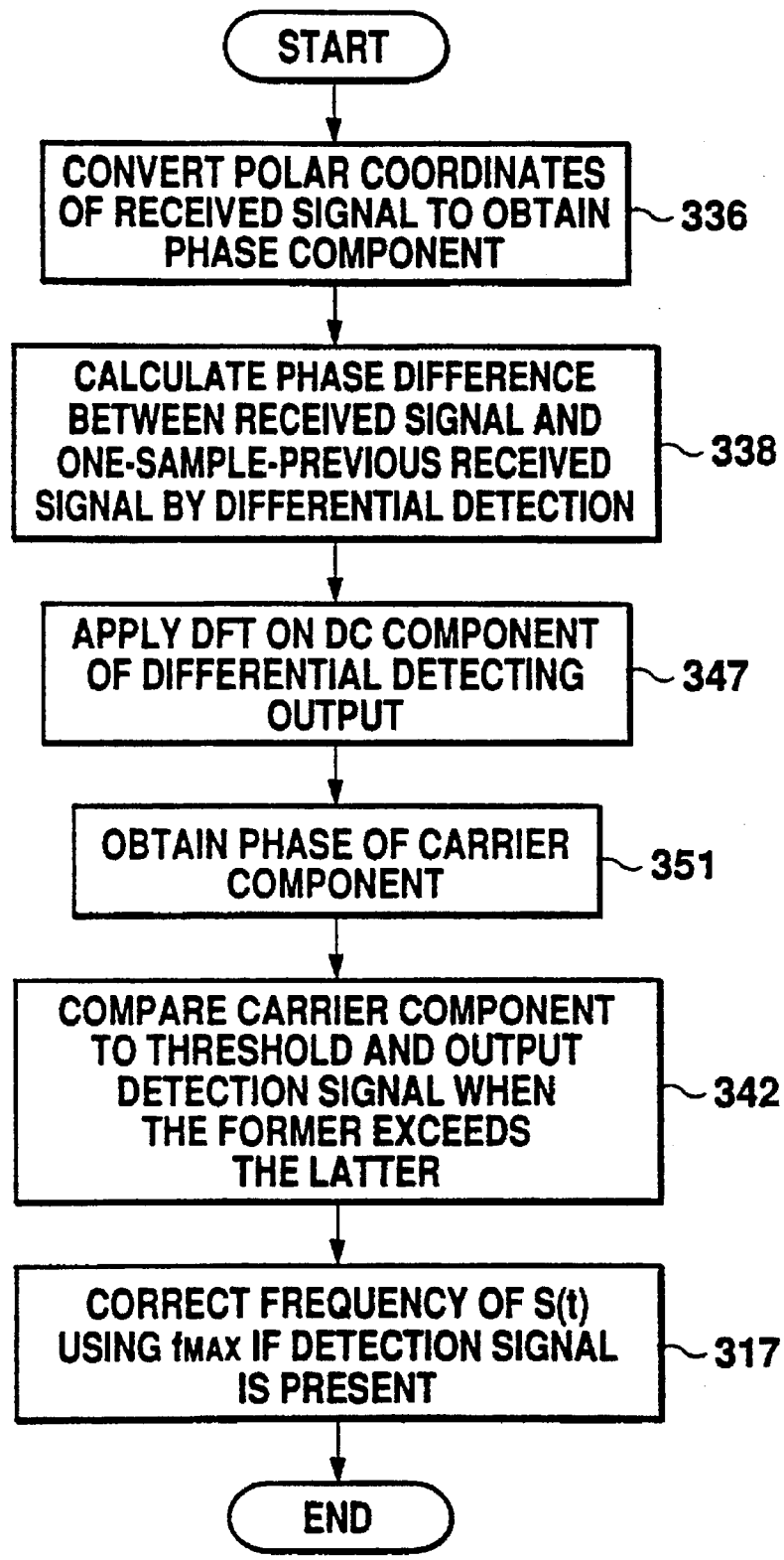
FIG. 39 is a flow diagram showing operation of the detector in FIG. 38.

FIG. 38 is a block diagram showing a carrier detector according to this embodiment of the present invention, and FIG. 39 is a flow diagram showing operation of the detector in FIG. 38.

In FIG. 38, the numerals 100a, 100b and 100c designate the same components as those in the ninth embodiment. The carrier component calculating section 104 and the decision section 37 are the same as those in the twentieth embodiment, and the frequency correcting circuit 34 is the same as that in the nineteenth embodiment.

As mentioned in the twentieth embodiment, the phase in the offset frequency would become DC component. Therefore, the offset frequency can be obtained by applying DFT to the differential detected result and detecting the phase in that DC component. The DFT 36 outputs the power spectrum and calculates the frequency offset at the same time. When a carrier detection signal is output, AFC could be applied to the received signal in the same manner as in the fourteenth embodiment.

Twenty-fourth Embodiment

Figure 40:
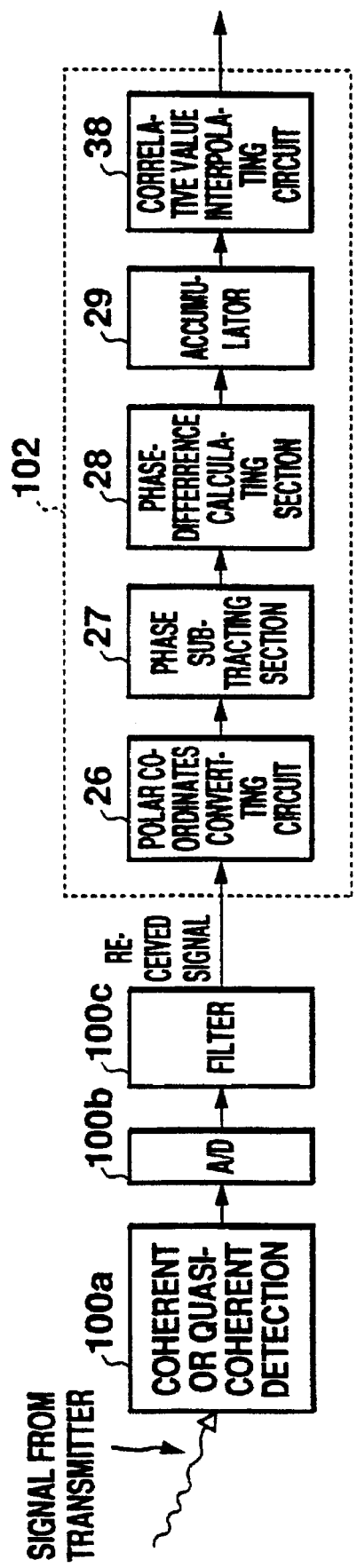
FIG. 40 is a block diagram showing a correlator according to a 24th embodiment of the present invention.
Figure 41:
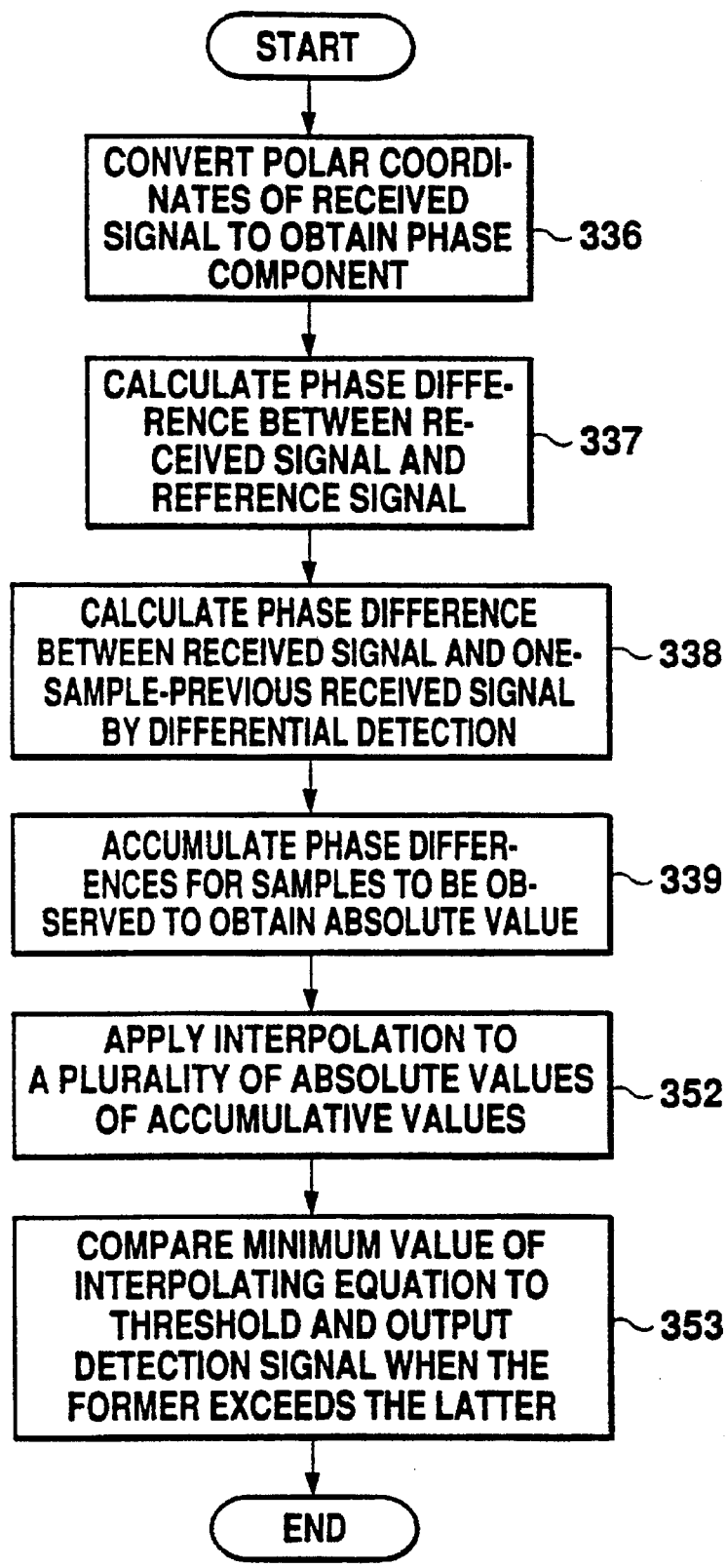
FIG. 41 is a flow diagram showing operation of the detector in FIG. 40.

FIG. 40 is a block diagram of a correlator showing an embodiment of the present invention, and FIG. 41 is a flow diagram showing operation of the section in FIG. 40.

In FIG. 40, the numerals 100a, 100b and 100c designate the same components as those in the ninth embodiment. The polar coordinates converting circuit 26, the phase subtracting section 27, the phase difference calculating section 28, and the accumulator 29 are the same as those in the seventeenth embodiment. The numeral 38 is a correlation interpolating circuit for interpolating an absolute value of the accumulative adding value by use of the output from the accumulator 29. The numeral 102 designates a correlator composed of the polar coordinates converting circuit 26, the phase subtracting section 27, the phase difference calculating section 28, the accumulator 29, and the correlation interpolating circuit 38.

Figure 42:
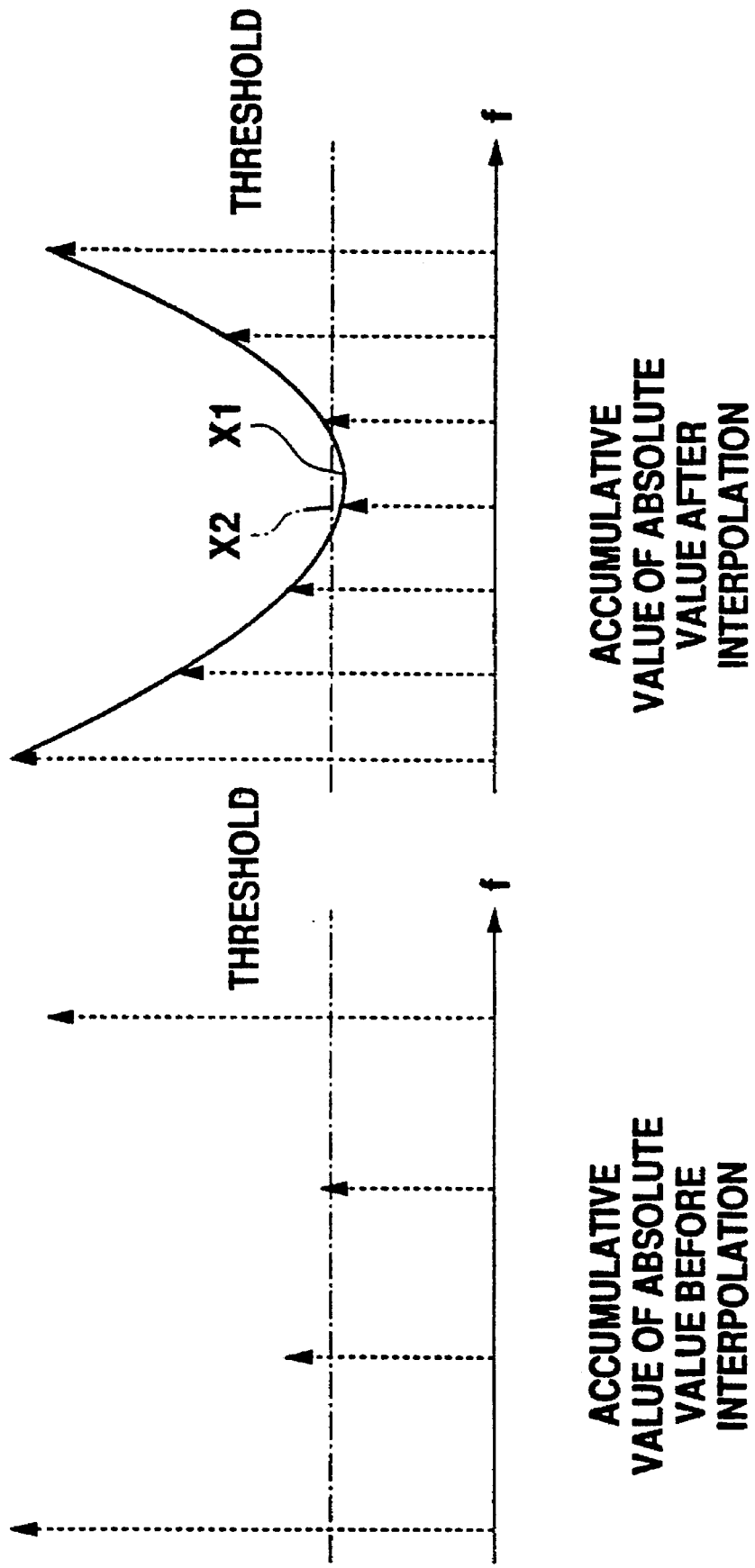
FIG. 42 is a diagram showing operation for interpolating a correlation.

The correlation interpolating circuit can be applied to the correlator in the eighteenth embodiment, but for simplification that of the seventeenth embodiment will now be described. For providing a correlation in the correlator, a correlation is calculated for a plurality of reference signals. However, if the frequency step of the reference signal is not small, $\{\Delta\omega-\Delta\omega_{REF}\}$ could not be sufficiently reduced. In this case, a miss detection state would erroneously arise though the burst is actually received. To cope with this problem, interpolation would be made for the absolute value of the accumulated value. An example of the interpolation will be described with reference to FIG. 42. An absolute value of an accumulated value having been interpolated by use of an interpolation equation (e.g. Lagrange interpolation formula) for the absolute value of the accumulated value. The correlator outputs a maximum value among the interpolating value. For outputting a minimum value, the minimum value of the interpolation formula (X1 in FIG. 42) could be output, or a minimum value among the dispersed sampling points (X2 in FIG. 42) could be output.

Further, for performing the interpolation, the calculating amount could be reduced by carrying out the interpolation only for a plurality of absolute values of the accumulated values including the minimum one. Further, for the application to the correlator in the eighteenth embodiment, it is possible to perform the interpolation only for the absolute value of the accumulated value with high reliability.

Twenty-fifth Embodiment

Figure 43:
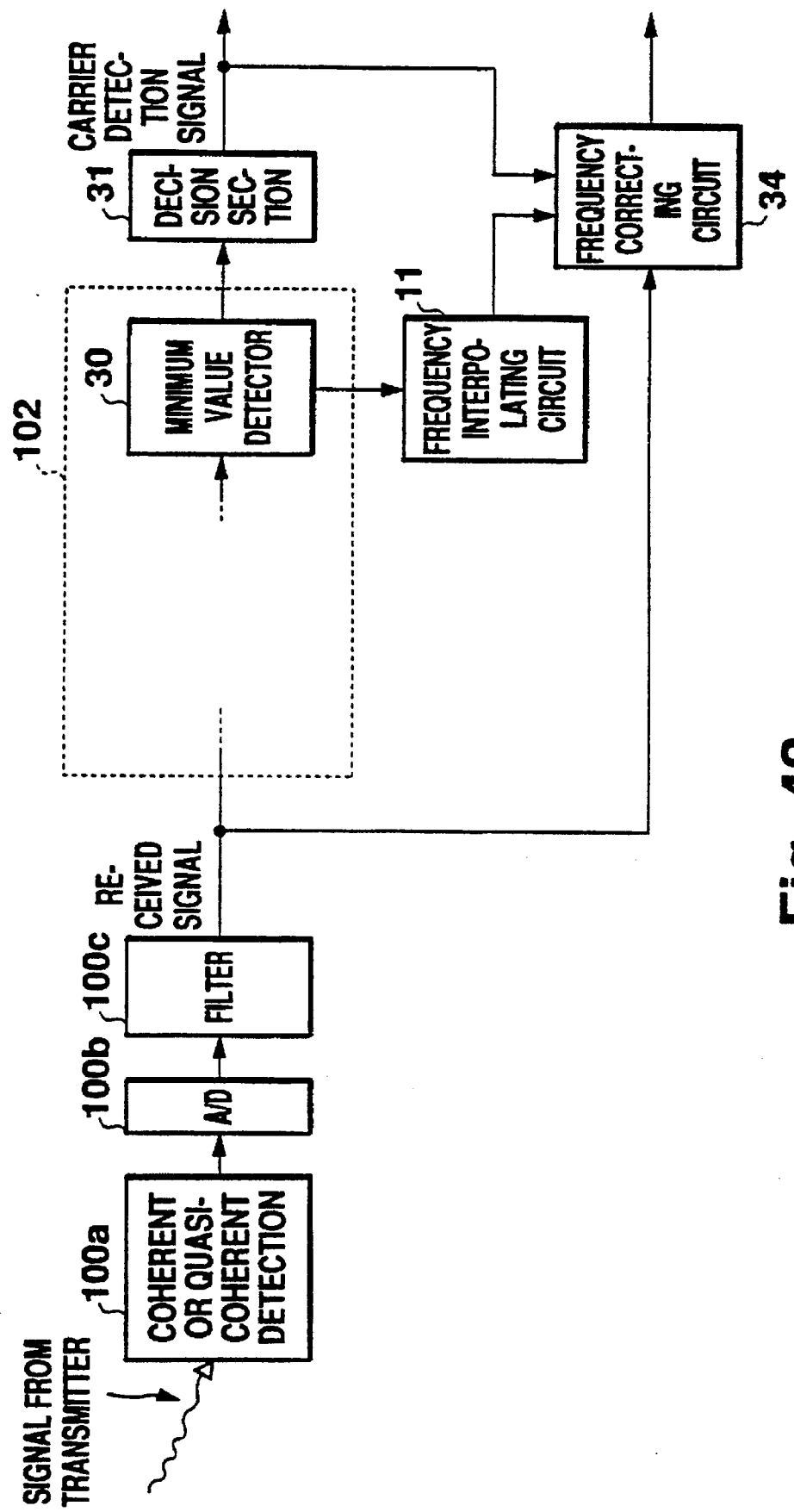
FIG. 43 is a block diagram of a carrier detector showing a 25th embodiment of the present invention.
Figure 44:
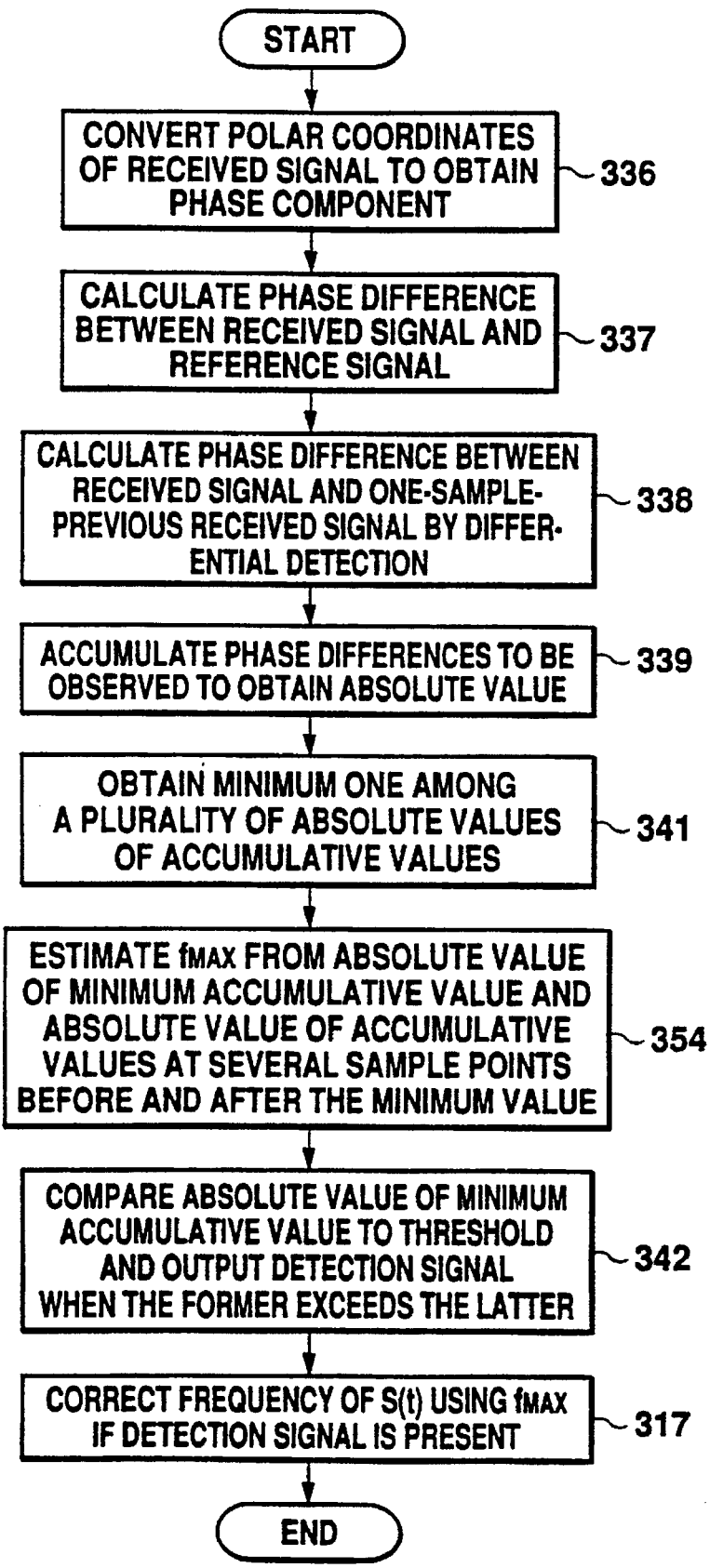
FIG. 44 is a flow diagram showing operation of the detector in FIG. 43.
Figure 45A:
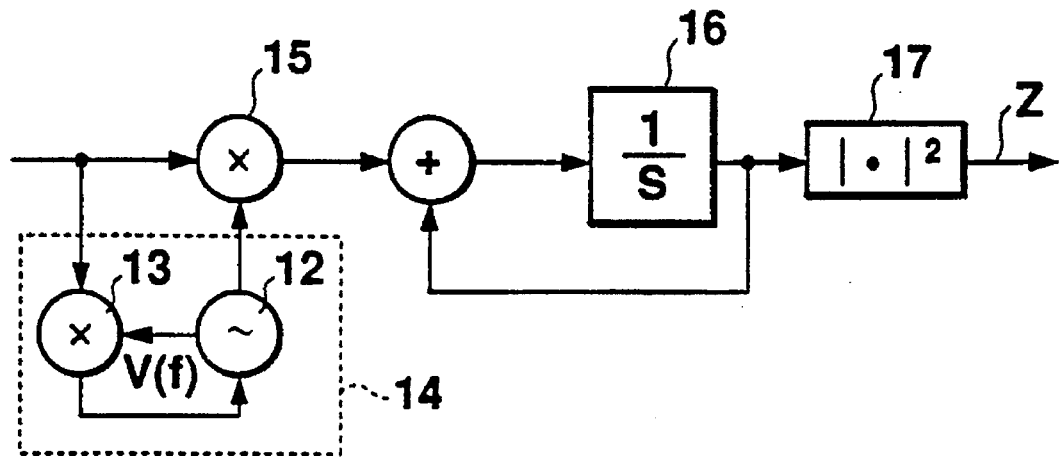
FIG. 45A shows a conventional distribution of power signal P(z)
Figure 45B:
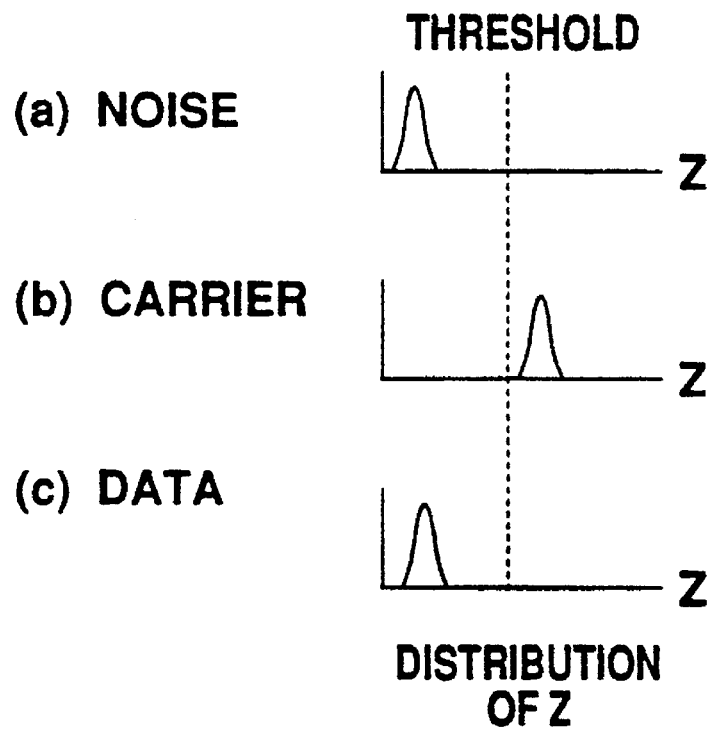
FIG. 45B is a block diagram showing a conventional carrier detector.
Figure 46:
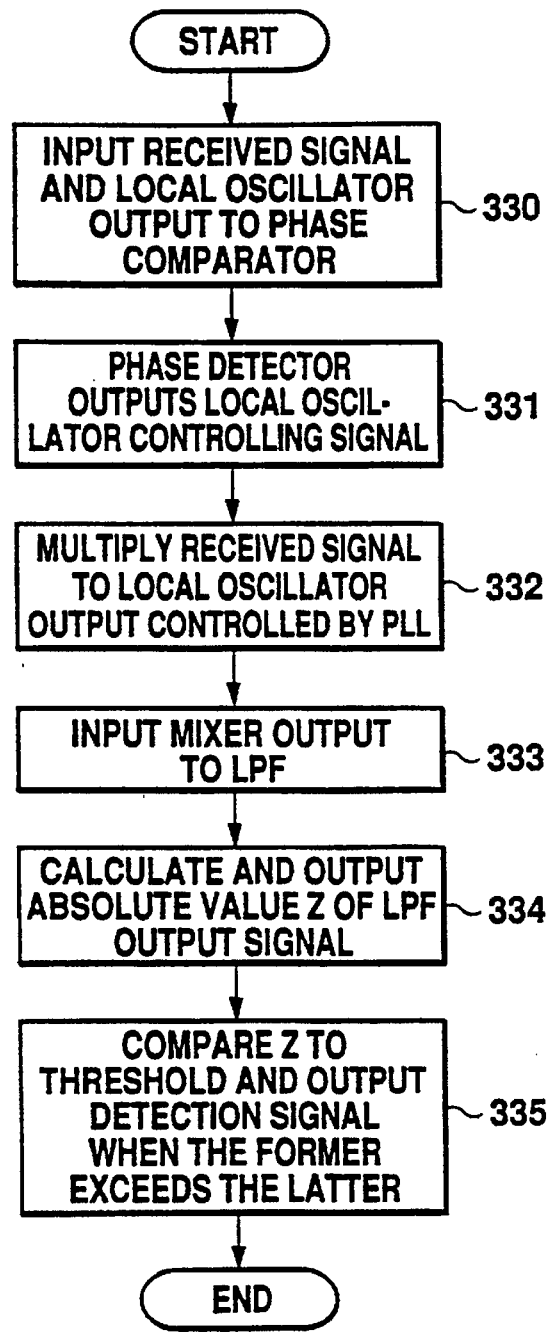
FIG. 46 is a flow diagram showing operation of the conventional detector in FIG. 45B.
Figure 47:
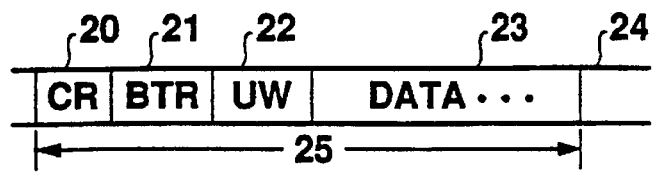
FIG. 47 is an example of a conventional burst format.

FIG. 43 is a block diagram of a correlator according to this embodiment of the present invention, FIG. 44 is a flow diagram showing operation of FIG. 43.

In FIG. 43, the numerals 100a, 100b and 100c are the same components as those in the ninth embodiment. The decision section 31, the frequency correcting circuit 34 and the correlator 102 are the same as those in the nineteenth embodiment. The frequency interpolating circuit 11 is the same as that in the sixteenth embodiment.

In the nineteenth embodiment, when the frequency step of the reference signal is not small, the difference between the formal offset frequency and the detected $f_{MAX}$ can not be reduced likewise to the case of the sixteenth embodiment. As a result, errors will arise in $f_{MAX}$. To cope with such an inconvenience, a frequency interpolating circuit is added. This frequency interpolating circuit interpolates a frequency of the received signal using a minimum value of the absolute value of the accumulated value obtained by the minimum value detector and the absolute value of the accumulated values at several sample points before and behind the minimum value, using e.g. Lagrange interpolation formula. The frequency interpolating circuit outputs the $f_{MAX}$ thus obtained by this interpolation. In this manner, highly improved AFC can be achieved.

In the frequency interpolating circuit in the twenty-fifth embodiment, an interpolation is carried out using an absolute value of a plurality of accumulated values for providing $f_{MAX}$, so this circuit can be used not only as a frequency interpolating circuit but also a correlation interpolating circuit described in the twenty-fourth embodiment.

As mentioned above, according to the present invention, it is possible to detect the carrier with higher accuracy than in the conventional method by processing signals on the frequency axis even when large frequency offset arises.

Further, by use of the multiplier, the modulating component due to the data can be eliminated. As a result, the carrier can be detected even when patterns other than the CR pattern are used. In addition, the carrier detecting accuracy can be improved by increasing the number of samples to be processed.

Using accumulated value of the power spectrums of continuous several samples serves to always stably calculate the power of the carrier so as to enable carrier detection to be performed with further accuracy.

In addition, the calculating amount could be reduced by calculating the accumulated value of the power spectra of continuous several samples only for a plurality of peaks that are candidates of the power spectrum.

Also, the level of the maximum value of the detected power spectrum is adjusted to correspond to the level of the received signal, which contributes to enhance the carrier detecting accuracy.

Moreover, the frequency offset of the received signal is calculated and used for correcting the frequency of the received signal, which is equivalent to the AFC function.

Further, since the maximum value level of the spectrum is adjusted by applying AFC to correspond to the received signal level, the carrier detecting accuracy is raised further.

Interpolating on the frequency axis further serves to improve the AFC effect.

Further, by carrying out the carrier detection by using only the phase component of the received signal, it is possible to detect a carrier with much more accuracy and less calculating amount than in the conventional method.

In addition, the carrier detecting accuracy can be improved by using the reliability calculating section capable of eliminating correlations of low reliability.

Correcting the frequency of the received signal using the frequency of the received signal would become equivalent to adding an AFC function.

By detecting the carrier with the phase difference after performing the differential detection for the received signal, the carrier can detected with less calculating than in the conventional method.

Further, the carrier detecting accuracy can improved by using the amplitude component of the differential detection in carrier detection.

Further, the carrier can be accurately detected by adjusting the level of the detected power spectrum to correspond to the received signal level.

Since the maximum value level of the detected power spectrum is adjusted to correspond to the received signal level, the carrier can be accurately detected with a function equivalent to AFC.

What is claimed is:

1. A carrier detector for detecting a carrier in a phase modulating signal, the carrier detector comprising:
a coherent detector for converting the phase modulating signal to a coherent detection signal;
an A/D converter, for converting the coherent detection signal to a digital signal;
a matched filter for eliminating noise in the digital signal to provide a received signal;
a carrier detection circuit including:
a time axis/frequency axis converting circuit for converting the received signal from a time axis to a frequency axis; and
an accumulator for calculating and outputting an accumulated value of power of the received signal expressed on the frequency axis; and
a decision section for comparing the accumulated value output from said accumulator to a predetermined threshold and outputting a carrier detection signal.

2. A carrier detector according to claim 1, wherein said carrier detector further includes:

a level detector, having an output, for detecting a level of the received signal; and an AGC (Automatic Gain Controlling) circuit being composed of an AGC amplifier for adjusting a level of the accumulative value of power output from the accumulator by use of the output signal from the level detector.

3. A carrier detector for detecting a carrier in a modulating signal, the carrier detector comprising:

a coherent detector for converting the modulating signal to a coherent detection signal;

an A/D converter, for converting the coherent detection signal to a digital signal;

a matched filter for eliminating noise in the digital signal to provide a received signal; a carrier detection circuit including:

a multiplier for multiplying the received signal by a second signal to provide a multiplied signal;

a time axis/frequency axis converting circuit for converting the multiplied signal from a time axis to a frequency axis; and a maximum value detector for calculating and outputting a maximum amplitude value of the multiplied signal having been expressed on the frequency axis; and a decision section for comparing the maximum amplitude value having been output from said maximum value detector to a predetermined threshold to determine a compared result and outputting a carrier detection signal based on the compared result.

4. A carrier detector for detecting a carrier in a modulating signal, the carrier detector comprising:

a coherent detector for converting the modulating signal to a coherent detection signal;

an A/D converter, for converting the coherent detection signal to a digital signal;

a matched filter for eliminating noise in the digital signal to provide a received signal;

a carrier detection circuit including:

a multiplier for multiplying the received signal by a second signal to provide a multiplied signal;

a time axis/frequency axis converting circuit for converting the multiplied signal from a time axis to a frequency axis;

an accumulator for calculating an accumulated value of the amplitude value of the multiplied signal expressed on the frequency axis for every several samples to output a plurality of accumulating values; and a maximum value detector for outputting the maximum of the plurality of accumulating values as an output signal of the carrier detection circuit; and a decision section for comparing the output signal from said carrier detection circuit to a predetermined threshold to output a carrier detection signal.

5. A carrier detector according to claim 4, said carrier detection circuit further including:

a peak detector, coupled between the time axis/frequency axis converting circuit and the accumulator, for calculating a plurality of peaks based on the amplitude value of the multiplied signal expressed on the frequency axis and providing the plurality of peaks to the accumulator.

6. A carrier detector according to any one of claims 3–5, wherein said carrier detector further includes:

a level detector, having an output, for detecting a level of the received signal; and an AGC (Automatic Gain Controlling) circuit being composed of an AGC amplifier for adjusting the level of the maximum value of the output from the maximum value detector by use of the output signal for the level detector.

7. A carrier detector according to any of claims 3–5, wherein said carrier detector further includes:

a frequency correcting circuit for correcting the frequency of the received signal based on the frequency information output from said carrier detection circuit.

8. A carrier detector according to any of claims 3–5, wherein said carrier detection circuit further includes:

a frequency interpolating circuit for interpolating the frequency of the received signal based on the frequency information output from said maximum value detector and the carrier detection signal.

9. A carrier detector according to any one of claims 3–5, wherein said carrier detector further includes:

a level detector for detecting a level of the received signal;

an AGC circuit including an AGC amplifier for adjusting the level of the maximum value of the output from the maximum value detector by use of the output signal from the level detector; and a frequency correcting circuit for correcting the frequency of the received signal based on the frequency information output from said carrier detector.

10. A carrier detector comprising:

an A/D converter for A/D converting a received signal to a digital signal with respect to a time axis; and a detecting means for expressing the digital signal being output from said A/D converter on a frequency axis and for detecting a carrier based on the signal expressed on the frequency axis.

11. A carrier detector comprising: a time axis/frequency axis converting circuit for expressing a received signal, having been expressed on the time axis, on a frequency axis;

an accumulator for calculating an accumulative value of power of the received signal expressed on the frequency axis; and a decision section for comparing the accumulative value of said accumulator to a predetermined threshold to output a carrier detection signal based on the comparison.

12. A carrier detector according to claim 11, wherein in said decision section, the carrier detection signal is activated when accumulative values from said accumulator continuously exceed the predetermined threshold for a time corresponding to a burst length.

13. A carrier detector comprising:

a multiplier for multiplying a received signal expressed on a time axis by a predetermined signal to generate a multiplied received signal;

a time axis—frequency axis converting circuit for expressing the multiplied received signal as a plurality of amplitudes on a frequency axis;

a maximum value detector for detecting a maximum amplitude value of the plurality of amplitudes expressed on the frequency axis; and a decision section for comparing the value detected in said detector to a predetermined threshold value to generate a compared result, and outputting a carrier detection signal based on the compared result.

14. A carrier detector according to claim 13, wherein in said decision section, the carrier detection signal is activated when the accumulative value of said accumulator continuously exceeds the predetermined threshold value for a time corresponding to a burst length.

15. A carrier detector comprising:
a multiplier for multiplying a received signal having been expressed on a time axis by a predetermined signal to generate a multiplied received signal;
a time axis—frequency axis converting circuit for expressing the multiplied received signal as a plurality of amplitudes on a frequency axis;
an accumulator for calculating an accumulative value of several sets of the plurality of amplitudes and for outputting a plurality of accumulative values of amplitude; and
a maximum value detector for detecting a maximum value of the plurality of accumulative values of amplitude; and
a decision section for comparing a maximum value detected by said maximum value detector to a predetermined threshold value to determine a compared result, and for outputting a carrier detection signal based on the compared result.

16. A carrier detector according to claim 15, wherein in said decision section, the carrier detection signal is activated when accumulative values from said accumulator continuously exceed the predetermined threshold value for a time corresponding to a burst length.

17. A carrier detector according to claim 15, further including a peak detector, coupled between the time axis/frequency axis converting circuit and the accumulator, for detecting a plurality of peaks from the plurality of amplitudes.

18. A carrier detector according to claim 17, wherein in said decision section, the carrier detection signal is activated when the accumulative values from said accumulator continuously exceed the predetermined threshold value for a time corresponding to a burst length.

19. A carrier detector according to any one of claims 13–17 or 18, further including:
a level detector for detecting a level of the received signal;
an adjusting circuit for adjusting a power level of the value output from said carrier detector in response to the level of the received signal; and
a frequency correcting circuit for correcting the frequency of the received signal based on the output of the maximum value detector.

20. A carrier detector according to any of claims 11–12, further including:
a level detector for detecting a level of the received signal; and
an adjusting circuit for adjusting a power level of the accumulative value output from the accumulator in response to the level of the received signal.

21. A carrier detector according to any of claims 13–17 or 18, further including:
a level detector for detecting a level of the received signal; and
an adjusting circuit for adjusting a power level of the maximum amplitude value of the maximum value detector in response to the level of the received signal.

22. A carrier detector according to any of claims 13–17 or 18, further including a frequency correcting circuit for correcting the frequency of the received signal based on the output of the maximum value detector.

23. A carrier detector according to any of claims 13–17 or 18, further including a frequency interpolating circuit for interpolating frequency of the received signal based on the output of the maximum value detector.

24. A carrier detector comprising:
a correlator for calculating a first phase correlation of a first part of a received signal to a reference signal, and for calculating a second phase correlation of a second part of the received signal to the reference signal;
a phase difference calculator, for determining a phase difference between the first phase correlation and the second phase correlation;
a minimum value detector, having an output, for outputting a minimum accumulated value of the phase difference; and
a decision section for comparing the output of the minimum value detector to a predetermined threshold to generate a compared result, and outputting a carrier detection signal based on the compared result.

25. A carrier detector according to claim 24, wherein, in said decision section, the carrier detection signal is activated when the minimum accumulated value detected by said minimum value detector exceeds the predetermined threshold for a time corresponding to a burst time.

26. A carrier detector according to claim 24, further including a reliability calculating section for calculating a reliability of the phase difference and for eliminating relative values of low reliability.

27. A carrier detector according to claim 24 or 26, further including a frequency correcting circuit for correcting the frequency of the received signal based on output of the minimum value detector.

28. A carrier detector according to claim 27, wherein said frequency correcting circuit further includes a frequency interpolating circuit for interpolating the frequency of the received signal.

29. The carrier detector of claim 27, wherein the reliability calculating section includes:
an absolute value detector for determining an absolute value of the phase difference; and
an accumulator, for providing an accumulated value of the absolute value of the phase difference to the minimum value detector.

30. A carrier detector according to any of claims 24–26, further including a correlation interpolating circuit for interpolating the second phase correlation.

31. A carrier detector for detecting a carrier in a received signal, said carrier detector comprising:
a first carrier component calculator for calculating a phase difference between a phase of the received signal and a phase of a previous received signal;
a second carrier component calculator for calculating a carrier component based on the phase difference; and
a decision section for comparing an output from said second carrier component calculator to a predetermined threshold to generate a compared result and for outputting a carrier detection signal based on the compared result.

32. A carrier detector according to claim 31, wherein:
said first carrier component calculator further calculates an amplitude difference between an amplitude of the received signal and an amplitude of the previous received signal; and
said second carrier further calculates the carrier component based on the amplitude difference.

33. A carrier detector according to claim 32, further including:
a level detector for detecting a level of the received signal; and
an adjusting circuit for adjusting a power level of a value output from said second carrier component calculator in response to the level of the received signal.

34. A carrier detector according to claim 31, further including a frequency correcting circuit for correcting the frequency of the received signal based on the output from said second carrier component calculator.

35. The carrier detector of claim 31, wherein the second carrier component calculator is a discrete fourier transform circuit.

36. A carrier detector for detecting a carrier in a modulating signal, comprising:

a coherent detector for converting the modulating signal to a coherent detection signal;

an A/D converter, for converting the coherent detection signal to a digital signal;

a matched filter for eliminating noise in the digital signal to provide a received signal; and a detecting means for expressing the received signal being on a frequency axis and for detecting a carrier based on the signal expressed on the frequency axis.

* * * * *